(12) United States Patent
Terada

(10) Patent No.: US 9,786,752 B2
(45) Date of Patent: Oct. 10, 2017

(54) SEMICONDUCTOR DEVICE AND METHOD FOR MANUFACTURING SEMICONDUCTOR DEVICE

(71) Applicant: ROHM CO., LTD., Kyoto (JP)

(72) Inventor: Chikara Terada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/177,820

(22) Filed: Feb. 11, 2014

(65) Prior Publication Data

US 2014/0284681 A1 Sep. 25, 2014

(30) Foreign Application Priority Data

Mar. 19, 2013 (JP) .................................. 2013-057308
Mar. 19, 2013 (JP) .................................. 2013-057309

(51) Int. Cl.

| | |
|---|---|
| *H01L 29/423* | (2006.01) |
| *H01L 21/762* | (2006.01) |
| *H01L 27/11546* | (2017.01) |
| *H01L 29/788* | (2006.01) |
| *H01L 21/8238* | (2006.01) |
| *H01L 27/092* | (2006.01) |

(52) U.S. Cl.
CPC .. *H01L 29/42324* (2013.01); *H01L 21/76224* (2013.01); *H01L 21/823814* (2013.01); *H01L 21/823857* (2013.01); *H01L 21/823878* (2013.01); *H01L 21/823892* (2013.01); *H01L 27/0928* (2013.01); *H01L 27/11546* (2013.01); *H01L 29/7881* (2013.01)

(58) Field of Classification Search
CPC .................... H01L 29/42324; H01L 21/76224
USPC .................. 257/319; 438/257, 261, 262, 424
See application file for complete search history.

(56) References Cited

U.S. PATENT DOCUMENTS

| | | | | |
|---|---|---|---|---|
| 5,510,283 A | * | 4/1996 | Maari | ............................ 438/262 |
| 2001/0014503 A1 | * | 8/2001 | Iguchi | .................... H01L 27/115 438/261 |
| 2003/0203594 A1 | * | 10/2003 | Shimizu | ............. H01L 27/11521 438/424 |

FOREIGN PATENT DOCUMENTS

JP    H09-283643 A    10/1997

* cited by examiner

*Primary Examiner* — Errol Fernandes
(74) *Attorney, Agent, or Firm* — Rabin & Berdo, P.C.

(57) ABSTRACT

A semiconductor device of the present invention is a semiconductor device selectively including a nonvolatile memory cell on a semiconductor substrate, and includes a trench formed in the semiconductor substrate, an element separation portion buried into the trench such that the element separation portion has a projecting part projecting from the semiconductor substrate, the element separation portion defining an active region in first a region for the nonvolatile memory cell of the semiconductor substrate, and a floating gate disposed in the active region such that the floating gate selectively has an overlapping part overlapping the element separation portion, and the floating gate has a shape recessed with respect to the overlapping part.

11 Claims, 60 Drawing Sheets

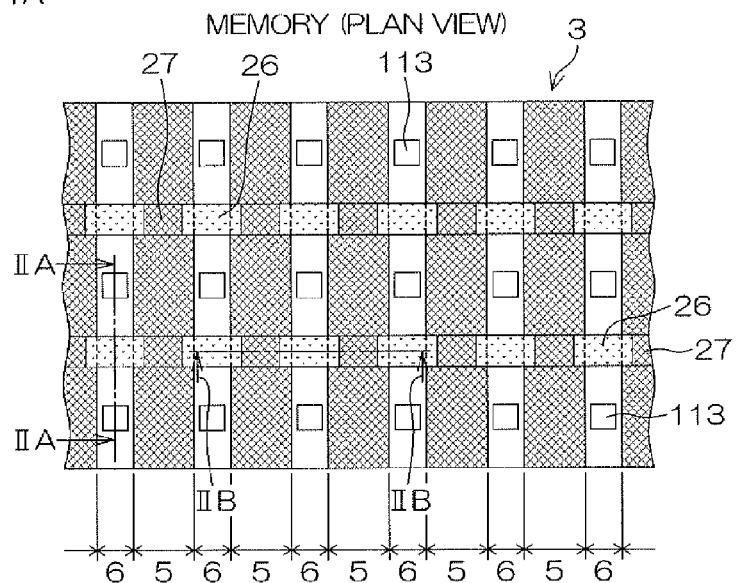
FIG. 1A MEMORY (PLAN VIEW)
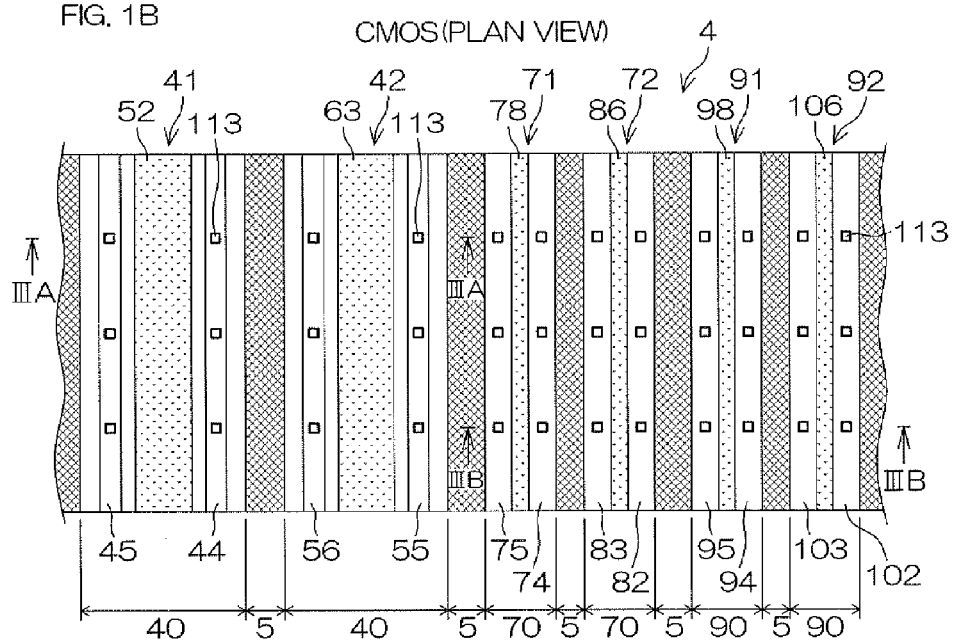
FIG. 1B CMOS (PLAN VIEW)

IIA-IIA

IIB-IIB

IIIA-IIIA

IIIB-IIIB

IIA-IIA

IIB-IIB

IIIA-IIIA

IIIB-IIIB

IIA-IIA

IIB-IIB

IIIA-IIIA
HV-CMOS

IIIB-IIIB
MV-CMOS    LV-CMOS

IIA-IIA

IIB-IIB

IIIA-IIIA

IIIB-IIIB

IIA-IIA

IIB-IIB

IIIA-IIIA

IIIB-IIIB

IIA-IIA

IIB-IIB

IIIA-IIIA

IIIB-IIIB

IIA-IIA

IIB-IIB

IIIA-IIIA          HV-CMOS

IIIB-IIIB

MV-CMOS          LV-CMOS

IIA-IIA

IIB-IIB

IIA-IIA

IIB-IIB

IIIA-IIIA
HV-CMOS

IIIB-IIIB
MV-CMOS    LV-CMOS

IIA-IIA

IIB-IIB

IIIA-IIIA

IIIB-IIIB

IIIA-IIIA

IIIB-IIIB

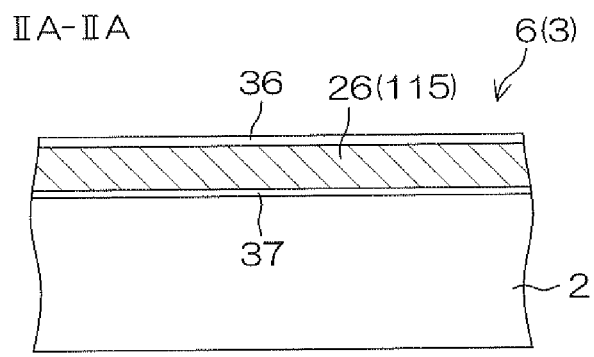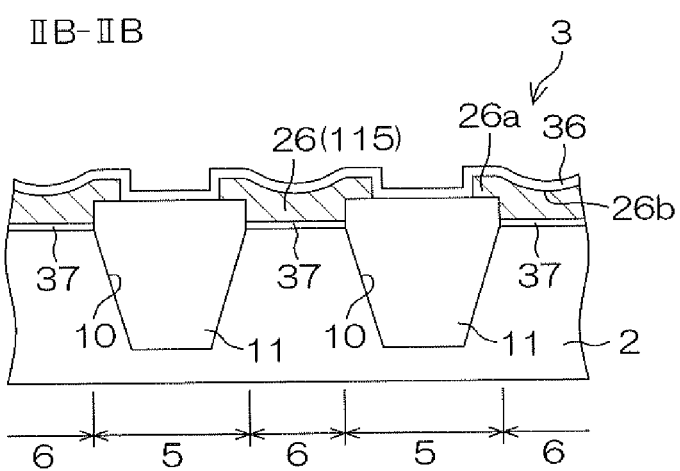

IIIA-IIIA

HV-CMOS

IIIB-IIIB

MV-CMOS          LV-CMOS

IIA-IIA

IIB-IIB

IIIA-IIIA

IIIB-IIIB

IIA-IIA

IIB-IIB

IIIA-IIIA

HV-CMOS

IIIB-IIIB

MV-CMOS          LV-CMOS

ⅡA-ⅡA

ⅡB-ⅡB

IIA-IIA

IIB-IIB

ⅡA-ⅡA

ⅡB-ⅡB

IIIA-IIIA

HV-CMOS

IIIB-IIIB

MV-CMOS    LV-CMOS

IIA-IIA

IIB-IIB

IIIA-IIIA

HV-CMOS

IIIB-IIIB

MV-CMOS    LV-CMOS

IIA-IIA

IIB-IIB

IIIA-IIIA

IIIB-IIIB

IIA-IIA

IIB-IIB

FIG. 42
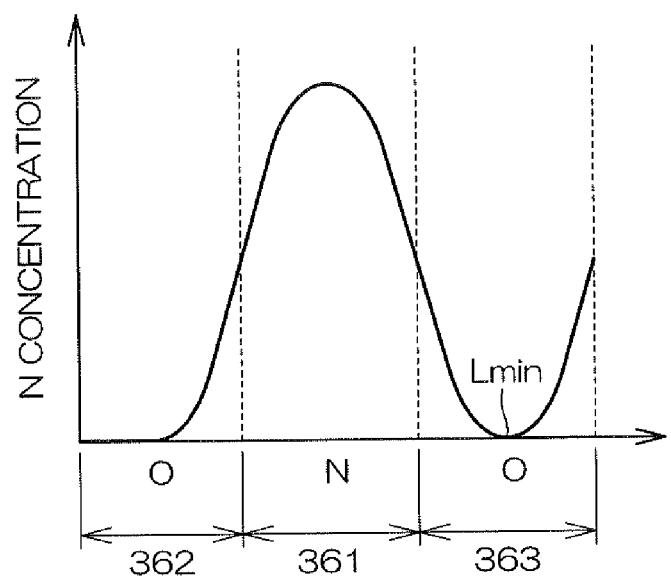
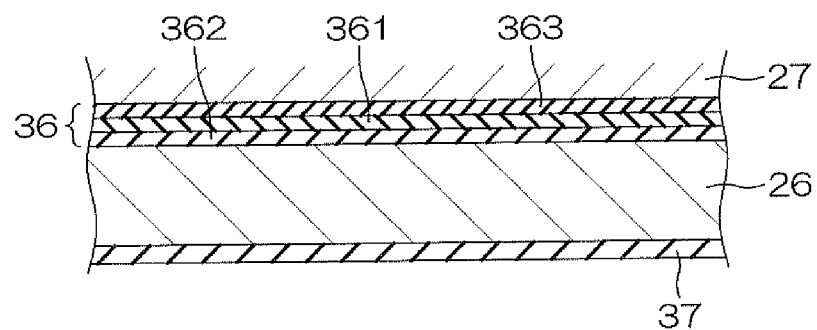

IIA-IIA

IIB-IIB

IIA-IIA

IIB-IIB

IIA-IIA

IIB-IIB

IIA-IIA

IIB-IIB

IIA-IIA

IIB-IIB

IIA-IIA

IIB-IIB

IIA-IIA

IIB-IIB

IIA-IIA

IIB-IIB

IIA-IIA

IIB-IIB

IIA-IIA

IIB-IIB

IIA-IIA

IIB-IIB

IIA-IIA

IIB-IIB

IIA-IIA

IIB-IIB

IIA-IIA

IIB-IIB

IIA-IIA

IIB-IIB

IIA-IIA

IIB-IIB

SEMICONDUCTOR DEVICE AND METHOD FOR MANUFACTURING SEMICONDUCTOR DEVICE

CROSS-REFERENCE TO RELATED APPLICATIONS

The present application corresponds to Japanese Patent Application No. 2013-57308 filed on Mar. 19, 2013 in the Japan Patent Office and Japanese Patent Application No. 2013-57309 filed on Mar. 19, 2013, and the entire disclosures of these applications are incorporated herein by reference.

FIELD OF THE INVENTION

The present invention relates to a semiconductor device including nonvolatile memory cells and a method for manufacturing the same.

BACKGROUND ART

Patent Document 1 (Japanese Unexamined Patent Publication No. 09-283643) discloses a nonvolatile memory-type semiconductor device having a control gate and a floating gate, merged with a logic circuit. Said semiconductor device is formed with a plurality of separation regions of a field oxide film by a LOCOS method or the like. A memory cell and a select transistor for the memory cell are formed in an element forming region between the respective separation regions.

BRIEF SUMMARY OF THE INVENTION

Methods for improving floating gate-type nonvolatile memories in writing speed and erasing speed include a method of reducing the width of an active region and a method of increasing the surface area of a floating gate to improve the coupling ratio. However, because the width of an active region is restricted in size by design rules, an improvement in coupling ratio is demanded.

It is an object of the present invention to provide a semiconductor device that allows increasing the surface area of a floating gate and thus allows improving the coupling ratio of a nonvolatile memory cell regardless of the width of an active region and a method for manufacturing the same.

BRIEF DESCRIPTION OF THE DRAWINGS

FIG. 1A is a plan view of a memory cell region of a semiconductor device according to an embodiment of the present invention.

FIG. 1B is a plan view of a CMOS region of a semiconductor device according to an embodiment of the present invention.

FIGS. 5A and 5B to FIGS. 40A and 40B are sectional views for explaining in the order of steps an example of a manufacturing process of the semiconductor device.

FIG. 42 is a graph for explaining an N component concentration in an ONO film.

FIGS. 43A and 43B to FIGS. 60A and 60B are sectional views for explaining in the order of steps an example of a manufacturing process of the semiconductor device.

DETAILED DESCRIPTION OF THE INVENTION

Figure 2A:
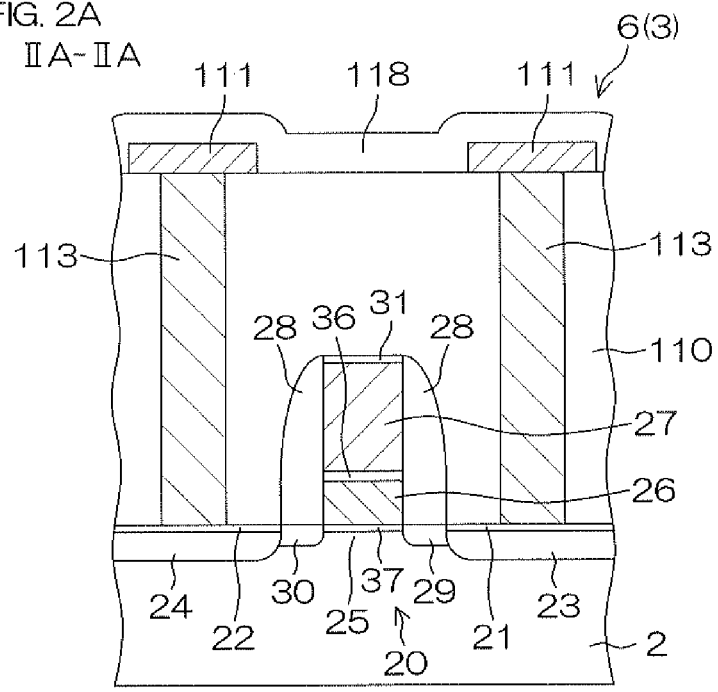
FIG. 2A is a sectional view that appears when the semiconductor device is cut along a cutting line IIA-IIA of FIG. 1A.

A semiconductor device of the present invention is a semiconductor device selectively including a nonvolatile memory cell on a semiconductor substrate, including a trench formed in the semiconductor substrate, an element separation portion buried into the trench such that the element separation portion has a projecting part projecting from the semiconductor substrate, the element separation portion defining an active region in a first region for the nonvolatile memory cell of the semiconductor substrate, and a floating gate disposed in the active region such that the floating gate selectively has an overlapping part overlapping the element separation portion, in which the floating gate has a shape recessed with respect to the overlapping part.

According to this arrangement, the element separation portion is buried so as to project from the semiconductor substrate, and the floating gate is formed so as to overlap said element separation portion. Accordingly, the floating gate is formed in a shape recessed with respect to said overlapping part, and thus has a surface area greater than that of a floating gate not having a recess. As a result, the floating gate is enhanced in coupling ratio, and characteristics of the writing speed and erasing speed of the semiconductor device can be enhanced.

Also, the active region may be formed in plural numbers so as to be adjacent across the element separation portion, and floating gates on the active regions adjacent to each other may overlap at their end portions with the element separation portion in common.

In this arrangement, the same effects as the above-described effects can be provided in the plurality of floating gates. Also, because the plurality of floating gates share the element separation portion, the memory cell can also be miniaturized.

Also, the floating gate may overlap at both end portions thereof with the element separation portions, and may have a concave surface in a central part sandwiched by both end portions.

Also, the projecting part may have a side face vertical to the front surface of the semiconductor substrate, and the element separation portion may include an STI (Shallow Trench Isolation) structure for which the trench is filled back with an insulating material.

As in these arrangements, also by forming various element separation portions, the same effects as the above-described effects can be provided.

Also, in the semiconductor device, the active region may have a width of 0.13 μm or more.

In this arrangement, the surface area of the floating gate can be secured, while the width of the active region can be narrowed. As a result, the semiconductor device can be miniaturized, while writing/erasing characteristics of the semiconductor device can be enhanced.

Also, the semiconductor device may further include another semiconductor element formed in a second region out of the first region, and the element separation portion may further define an active region in the second region. Also, a projection amount of the element separation portion in the second region may be smaller than a projection amount of the element separation portion in the first region. Also, the other semiconductor element may include a CMOS transistor.

Also, a method for manufacturing a semiconductor device of the present invention is a method for manufacturing a semiconductor device selectively including a nonvolatile memory cell on a semiconductor substrate, including a step of forming a trench in the semiconductor substrate in order to define an active region in a first region for the nonvolatile memory cell of the semiconductor substrate, a step of burying, into the trench, an element separation portion so as to project from the semiconductor substrate, and a step of forming a floating gate in the active region so as to selectively overlap the element separation portion.

In this arrangement, a semiconductor device that provides the same effects as the above-described effects can be manufactured.

Also, the step of burying the element separation portion may include a step of forming a sacrificial film having an opening to selectively expose the trench on the semiconductor substrate, a step of filling a material for the element separation portion from the trench up to the opening in the sacrificial film, and a step of removing the sacrificial film after burying of the element separation portion to remain a part of the element separation portion inside the opening as a projecting part with respect to the semiconductor substrate.

In this arrangement, an element separation portion having the projecting part can be simply formed.

Also, the sacrificial film may be formed prior to formation of the trench, and the step of forming the trench may include a step of forming the trench by etching from the opening in the sacrificial film.

In this arrangement, because a common sacrificial film can be used in the step of forming a trench and the step of filling a material for the element separation portion, simplification and a reduction in cost of the manufacturing process can be achieved.

Also, the sacrificial film may be made of a material having etching selectivity with respect to the element separation portion. Also, the element separation portion may be made of silicon oxide, and the sacrificial film may be made of silicon nitride.

In these arrangements, when etching the sacrificial film for removal, etching of the projecting part of the element separation portion together with the sacrificial film can be suppressed. Accordingly, after removal of the sacrificial film, said projecting part can reliably remain.

Hereinafter, embodiments of the present invention will be described in detail with reference to the accompanying drawings.

Figure 2B:
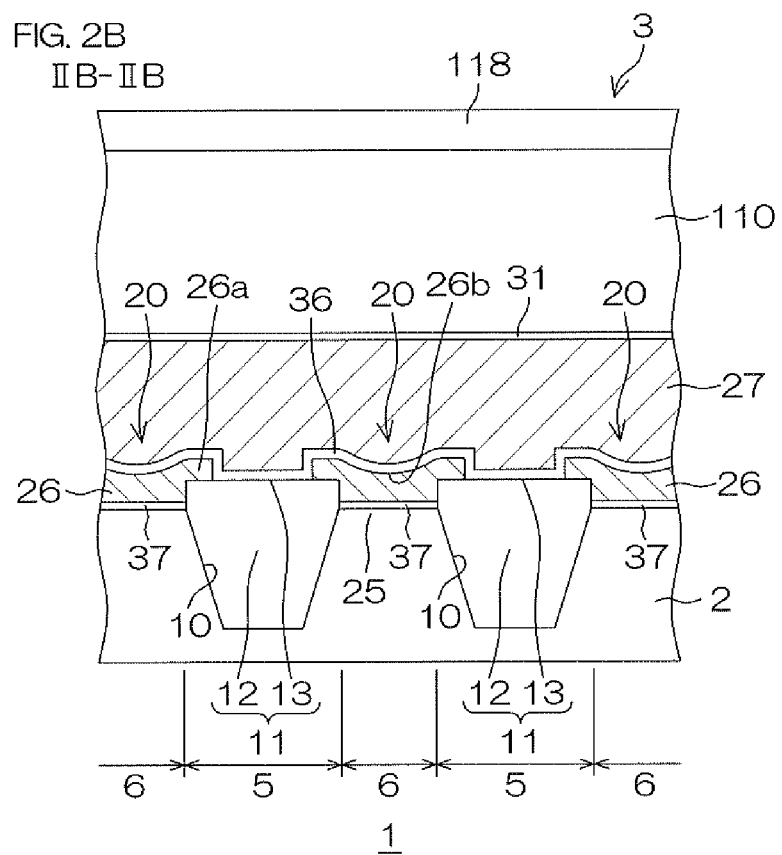
FIG. 2B is a sectional view that appears when the semiconductor device is cut along a cutting line IIB-IIB of FIG. 1A.
Figure 3A:
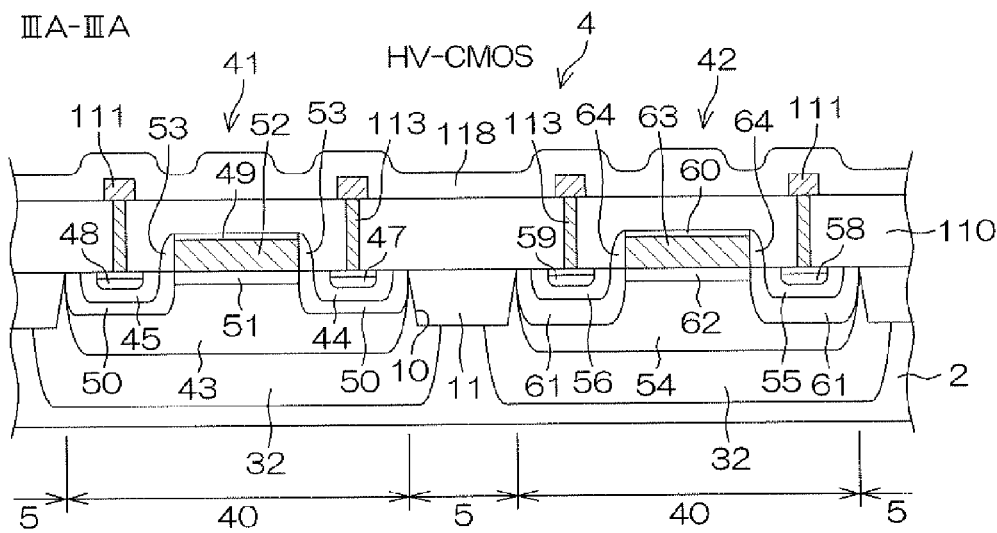
FIG. 3A is a sectional view that appears when the semiconductor device is cut along a cutting line IIIA-IIIA of FIG. 1B.
Figure 3B:
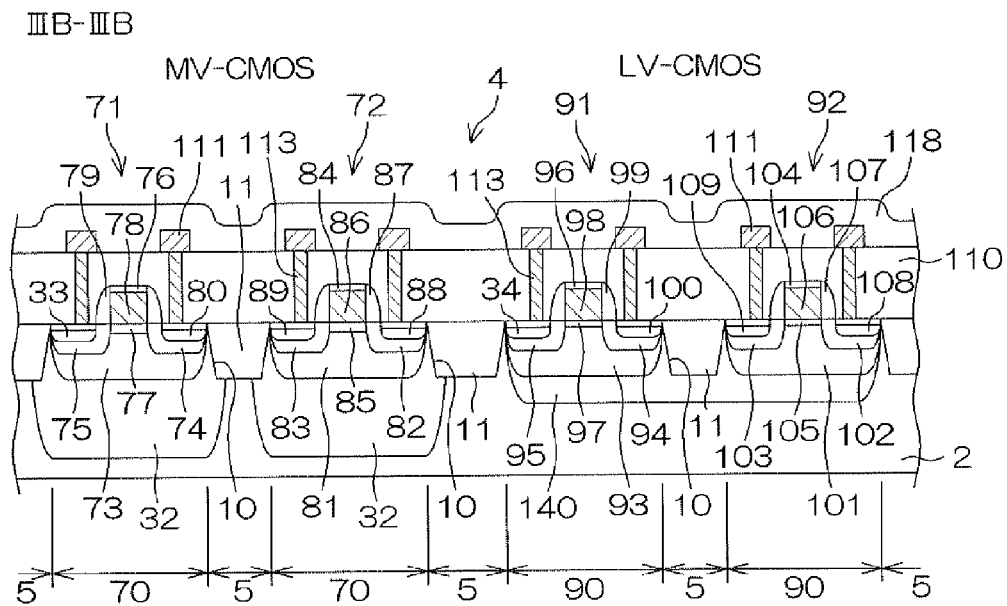
FIG. 3B is a sectional view that appears when the semiconductor device is cut along a cutting line IIIB-IIIB of FIG. 1B.

FIG. 1A is a plan view showing a memory cell region 3 of a semiconductor device 1, and FIG. 1B is a plan view showing a CMOS region 4 of the semiconductor device 1. Also, FIG. 2A is a sectional view that appears when the semiconductor device 1 is cut along a cutting line IIA-IIA of FIG. 1A. FIG. 2B is a sectional view that appears when the semiconductor device 1 is cut along a cutting line IIB-IIB of FIG. 1A. Also, FIG. 3A is a sectional view that appears when the semiconductor device 1 is cut along a cutting line IIIA-IIIA of FIG. 1B. FIG. 3B is a sectional view that appears when the semiconductor device 1 is cut along a cutting line IIIB-IIIB of FIG. 1B.

In the following, first, the memory cell region 3 of the semiconductor device 1 will be described with reference to FIG. 1A and FIGS. 2A and 2B, and next, the CMOS region 4 of the semiconductor device 1 will be described with reference to FIG. 1B and FIGS. 3A and 3B.

<Memory Cell Region>

The semiconductor device 1 includes a semiconductor substrate 2 and a memory cell region 3 set on the semiconductor substrate 2. The semiconductor substrate 2 is, for example, a silicon substrate having a p-type conductivity.

The memory cell region 3 is defined into a plurality of active regions 6 by an element separation portion 5. The element separation portion 5 includes a trench 10 formed in a front surface of the semiconductor substrate 2 and a buried insulating film 11 buried into the trench 10.

The trenches 10 are, in the present embodiment, arrayed in a stripe form such that linear line trenches become parallel to each other. The distance between mutually adjacent trenches 10 is, for example, 0.13 μm or more, and preferably, 0.17 μm to 0.19 μm. This distance corresponds to the width of each active region 6. Each trench 10 is, in a sectional view when cut in its width direction orthogonal to the longitudinal direction (hereinafter, simply referred to as a "sectional view"), formed in a tapered form to have a narrower width in a depth direction from an opening end toward a bottom portion. Also, the trenches 10, in the present embodiment, are shallow trenches having depths of 0.23 μm to 0.25 μm, but their depth can be appropriately changed.

The buried insulating film 11 is made of silicon oxide ($SiO_2$), and integrally includes a buried part 12 housed inside the trench 10 and a projecting part 13 formed outside the trench 10 and projecting upward further than the front surface of the semiconductor substrate 2.

The buried part 12 is, in a sectional view, formed in a tapered form to have a narrower width following the shape of the trench 10, and has side faces inclined with respect to the front surface of the semiconductor substrate 2. On the other hand, the projecting part 13 is, in a sectional view, formed in a square form projecting vertically with respect to the front surface of the semiconductor substrate 2, and has a top face (flat surface) parallel to the front surface of the semiconductor substrate 2 and side faces vertical thereto. Also, the projection amount of the projecting part 13 is, for example, 0.063 μm to 0.077 μm with reference to the front surface of the semiconductor substrate 2.

In each of the plurality of active regions 6 defined by the element separation portion 5, nonvolatile memory cells 20 (EEPROMs) are provided one each.

The nonvolatile memory cell 20 includes an n-type source region 23 and an n-type drain region 24 formed in a front surface portion of the semiconductor substrate 2 at an interval from each other, a floating gate 26 disposed so as to be opposed to a channel region 25 between the n-type source and drain regions 23 and 24, and a control gate 27 stacked on the floating gate 26. On front surfaces of the n-type source region 23, the n-type drain region 24, and the control gate 27, silicides 21, 22, and 31 are formed, respectively.

The floating gates 26 are provided one each for each active region 6. Each floating gate 26 is formed such that both end portions (overlapping parts 26a) in a width direction of the active region 6 orthogonal to the longitudinal direction overlap the projecting parts 13 of the buried insulating film 11.

Accordingly, in the floating gate 26, the overlapping parts 26a on the projecting part 13 are disposed at a relatively high position with respect to a central part 26b on the front surface of the semiconductor substrate 2, and the central part 26b is selectively recessed. The difference in height between the overlapping parts 26a and the central part 26b forms, in a top face (upper face) of the floating gate 26, a concave surface where the central part 26b selectively caves in. The concave surface, in the present embodiment, is a curved surface having a smooth downward incline from the overlapping parts 26a toward the central part 26b, and for example, its deepest portion is disposed at the middle in the width direction of the active region 6. In addition, the concave surface may be, for example, a stepped surface that is one step lower than a plane of the overlapping parts 26a.

The floating gates 26 in such shapes are provided one each for each active region 6 as described above. Thus, there are floating gates 26 disposed, for one element separation portion 5, each at one side in a width direction and the opposite side thereof, and those floating gates 26 overlap the buried insulating film 11 (projecting parts 13) of the common element separation portion 5.

The control gate 27 is formed in a linear form extending in the width direction of the active region 6 orthogonal to the longitudinal direction. The control gate 27 extends across the plurality of active regions 6, and covers all floating gates 26 collectively such that its upper face becomes flat. That is, the control gate 27 serves as a common electrode of the plurality of nonvolatile memory cells 20.

Specifically, the control gate 27 is formed such that one surface (lower face) follows a front surface of the floating gate 26 and the active region 6. Thus, the lower face of the control gate 27, over the floating gate 26, is a convex surface (for example, a curved convex surface) corresponding to the concave surface of the floating gate 26. On the other hand, the other surface (upper face) of the control gate 27 is, over the floating gate 26, formed as a flat surface parallel to the front surface of the semiconductor substrate 2.

Also, both side faces of the floating gate 26 and the control gate 27 in the longitudinal direction of the active region 6 are formed so as to be flush with each other. Accordingly, the stacked structure of the floating gate 26 and the control gate 27 has planar side faces without a step. That is, these two gates 26 and 27 fit in a region on the same space of the semiconductor substrate 2. These two gates 26 and 27 suppress variation in threshold voltage of the floating gate 26, and miniaturize the nonvolatile memory cell 20. Further, both side faces of the floating gate 26 and the control gate 27 are covered with sidewalls 28 made of an insulating material such as silicon nitride.

Between the n-type source region 23 and the n-type drain region 24 and the floating gate 26, that is, in regions directly under the sidewalls 28, a low-concentration n-type source layer 29 and a low-concentration n-type drain layer 30 are formed, respectively. Accordingly, an LDD (Lightly Doped Drain) structure is formed.

The low-concentration n-type source layer 29 and the low-concentration n-type drain layer 30 are regions that are formed to be lower in concentration than the n-type source and drain regions 23 and 24 and formed by doping impurity ions shallower than for these n-type source and drain regions 23 and 24. The low-concentration n-type source and drain regions 29 and 30 are formed in a self-aligned manner with respect to the floating gate 26 and the control gate 27. On the other hand, the n-type source and drain regions 23 and 24 are formed in a self-aligned manner with respect to the sidewalls 28.

At the front surface of the semiconductor substrate 2 in the channel region 25, a tunneling oxide film 37 is formed so as to be opposed to the floating gate 26. The thickness of the tunneling oxide film 37 is, for example, on the order of 90 Å. The tunneling oxide film 37 passes electrons by FN (Fowler-Nordheim) tunneling between the channel region 25 and the floating gate 26.

Also, the floating gate 26 and the control gate 27 are insulated by an insulating film therebetween. The insulating film is made of, for example, a film having an ONO (oxide film-nitride film-oxide film) structure for which a silicon nitride film is sandwiched by a pair of silicon oxide films (hereinafter, referred to as an ONO film 36). The ONO film 36 is formed such that its one surface and the other surface follow the front surface of the floating gate 26. Thus, the ONO film 36 also has a concave surface as in the floating gate 26.

<CMOS Region>

The semiconductor device 1 includes a HV-CMOS (High Voltage-Complementary Metal Oxide Semiconductor) region 40, a MV-CMOS (Middle Voltage-Complementary Metal Oxide Semiconductor) region 70, and a LV-CMOS (Low Voltage-Complementary Metal Oxide Semiconductor) region 90 on the common semiconductor substrate 2.

The HV-COMS region 40, the MV-CMOS region 70, and the LV-CMOS region 90 are separated from each other by the element separation portions 5. In the following, description will be given in the order of (1) the HV-CMOS region 40, (2) the MV-CMOS region 70, and (3) the LV-CMOS region 90.

(1) HV-CMOS Region

The HV-CMOS region 40 includes an n-type HV-nMOS 41 and a p-type HV-pMOS 42. The n-type HV-nMOS 41 and the p-type HV-pMOS 42 are separated from each other by the element separation portions 5 surrounding these MOSs 41 and 42 in rectangular forms. The HV-nMOS 41 and the HV-pMOS 42 are high-voltage elements whose rated voltage is, for example, over 5V and not more than 40V.

In a region for the HV-nMOS 41, a deep n-type well 32 is formed along sides of the element separation portions 5 surrounding the region in a rectangular form, and further, in an inner region of the deep n-type well 32, a p-type base region 43 is formed. The p-type base region 43 is formed such that its bottom portion becomes deeper than the trench 10.

At the front surface of the semiconductor substrate 2 in the p-type base region 43, a HV-nMOS gate insulating film 51 is formed. The HV-nMOS gate insulating film 51 is formed, for example, with a thickness of 380 Å to 440 Å. Moreover, in such a manner so as to be opposed to the semiconductor substrate 2 across the HV-nMOS gate insulating film 51, a HV-nMOS gate electrode 52 is formed. On a front surface of the HV-nMOS gate electrode 52, a silicide 49 is formed. Also, both side faces of the HV-nMOS gate electrode 52 are covered with sidewalls 53 made of an insulating material such as silicon nitride.

Moreover, on one side of the HV-nMOS gate electrode 52, a HV-n-type drift region 50, a HV-n-type source region 44, and a HV-n-type source contact region 47 are formed, and on the opposite side thereof, a HV-n-type drift region 50, a HV-n-type drain region 45, and a HV-n-type drain contact region 48 are formed.

The HV-n-type drift regions 50 are formed in a self-aligned manner with respect to the HV-nMOS gate electrode 52, and the HV-n-type source and drain regions 44 and 45 are respectively formed in a self-aligned manner with respect to the sidewalls 53. Also, the HV-n-type source and drain contact regions 47 and 48 are respectively formed in inner regions of the HV-n-type source and drain regions 44 and 45. Also, on front surfaces of the HV-n-type source and drain contact regions 47 and 48, silicides are respectively formed.

In a region for the HV-pMOS 42, similar to the region for the HV-nMOS 41, a deep n-type well 32 is formed along sides of the element separation portions 5 surrounding the region in a rectangular form, and further, in an inner region of the deep n-type well 32, an n-type base region 54 is formed. The n-type base region 54 is formed such that its bottom portion becomes deeper than the trench 10.

At the front surface of the semiconductor substrate 2 in the n-type base region 54, a HV-pMOS gate insulating film 62 is formed. The HV-pMOS gate insulating film 62 is formed with the same thickness as that of the HV-nMOS gate insulating film 51, for example, a thickness of 380 Å to 440 Å. Moreover, in such a manner so as to be opposed to the semiconductor substrate 2 across the HV-pMOS gate insulating film 62, a HV-pMOS gate electrode 63 is formed. On a front surface of the HV-pMOS gate electrode 63, a silicide 60 is formed. Also, both side faces of the HV-pMOS gate electrode 63 are covered with sidewalls 64 made of an insulating material such as silicon nitride.

Moreover, on one side of the HV-pMOS gate electrode 63, a HV-p-type drift region 61, a HV-p-type source region 55, and a HV-p-type source contact region 58 are formed, and on the opposite side thereof, a HV-p-type drift region 61, a HV-p-type drain region 56, and a HV-p-type drain contact region 59 are formed.

The HV-p-type drift regions 61 are formed deeper than the HV-n-type drift regions 50, and are formed in a self-aligned manner with respect to the HV-pMOS gate electrode 63. The HV-p-type source and drain regions 55 and 56 are formed with the same depth as that of the HV-n-type source and drain regions 44 and 45, and are respectively formed in a self-aligned manner with respect to sidewalls 64. Also, the HV-p-type source and drain contact regions 58 and 59 are formed with the same depth as that of the HV-n-type source and drain contact regions 47 and 48, and are respectively formed in inner regions of the HV-p-type source and drain regions 55 and 56. Also, on front surfaces of the HV-p-type source and drain contact regions 58 and 59, silicides are respectively formed.

(2) MV-CMOS Region

The MV-CMOS region 70 includes an n-type MV-nMOS 71 and a p-type MV-pMOS 72. The n-type MV-nMOS 71 and the p-type MV-pMOS 72 are separated from each other by the element separation portions 5 surrounding these MOSs 71 and 72 in rectangular forms. The MV-nMOS 71 and the MV-pMOS 72 are middle-voltage elements whose rated voltage is, for example, not less than 2V and not more than 5V.

In a region for the MV-nMOS 71, similar to the region for the HV-nMOS 41, a deep n-type well 32 is formed along sides of the element separation portions 5 surrounding the region in a rectangular form, and further, in an inner region of the deep n-type well 32, a MV-p-type well 73 is formed. The MV-p-type well 73 is formed to be higher in impurity concentration than the p-type base region 43 and shallower than the p-type base region 43. For example, the MV-p-type well 73 is formed such that its bottom portion becomes the same in depth position as the bottom portion of the trench 10. Also, the MV-p-type well 73 is formed with the same impurity concentration and the same depth as those of the HV-p-type drift region 61 and a LV-p-type well 93 to be described later.

In an inner region of the MV-p-type well 73, a MV-n-type source region 74 and a MV-n-type drain region 75 are formed at an interval from each other along the front surface of the semiconductor substrate 2. The region between the MV-n-type source region 74 and the MV-n-type drain region 75 serves as a channel region of the MV-p-type well 73.

At the front surface of the semiconductor substrate 2 in the region for the MV-nMOS 71, a MV-nMOS gate insulating film 77 is formed. The MV-nMOS gate insulating film 77 is formed thinner than the above-described HV-nMOS gate insulating film 51. Its thickness is, for example, 130 Å to 145 Å. Moreover, in such a manner so as to be opposed to the channel region of the MV-nMOS 71, a MV-nMOS gate electrode 78 is formed with the MV-nMOS gate insulating film 77 sandwiched therebetween. On a front surface of the MV-nMOS gate electrode 78, a silicide 76 is formed. Also, the MV-n-type source region 74 and the MV-n-type drain region 75 are formed in a self-aligned manner with respect to the MV-nMOS gate electrode 78.

Both side faces of the MV-nMOS gate electrode 78 are covered with sidewalls 79 made of an insulating material such as silicon nitride.

Moreover, in inner regions of the MV-n-type source and drain regions 74 and 75, a MV-n-type source contact region 80 and a MV-n-type drain contact region 33 are formed respectively in a self-aligned manner with respect to the sidewalls 79. Also, on front surfaces of the MV-n-type source and drain contact regions 80 and 33, silicides are respectively formed.

In a region for the MV-pMOS 72, similar to the region for the HV-nMOS 41, a deep n-type well 32 is formed along sides of the element separation portions 5 surrounding the region in a rectangular form, and further, in an inner region of the deep n-type well 32, a MV-n-type well 81 is formed. The MV-n-type well 81 is formed to be higher in impurity concentration than the n-type base region 54 and shallower than the n-type base region 54. For example, the MV-n-type well 81 is formed such that its bottom portion becomes the same in depth position as the bottom portion of the trench 10. Also, the MV-n-type well 81 is formed with the same impurity concentration and the same depth as those of a LV-n-type well 101 to be described later.

In an inner region of the MV-n-type well 81, a MV-p-type source region 82 and a MV-p-type drain region 83 are formed at an interval from each other along the front surface of the semiconductor substrate 2. The region between the MV-p-type source region 82 and the MV-p-type drain region 83 serves as a channel region of the MV-n-type well 81.

At the front surface of the semiconductor substrate 2 in the region for the MV-pMOS 72, a MV-pMOS gate insulating film 85 is formed. The MV-pMOS gate insulating film 85 is formed with the same thickness and the same material as those of the MV-nMOS gate insulating film 77. Moreover, in such a manner so as to be opposed to the channel region of the MV-pMOS 72, a MV-pMOS gate electrode 86 is formed with the MV-pMOS gate insulating film 85 sandwiched therebetween. On a front surface of the MV-pMOS gate electrode 86, a silicide 84 is formed. Also, the MV-p- type source region 82 and the MV-p-type drain region 83 are formed in a self-aligned manner with respect to the MV-pMOS gate electrode 86.

Both side faces of the MV-pMOS gate electrode 86 are covered with sidewalls 87 made of an insulating material such as silicon nitride.

Moreover, in inner regions of the MV-p-type source and drain regions 82 and 83, a MV-p-type source contact region 88 and a MV-p-type drain contact region 89 are formed respectively in a self-aligned manner with respect to the sidewalls 87. Also, on front surfaces of the MV-p-type source and drain contact regions 88 and 89, silicides are respectively formed.

(3) LV-CMOS Region

The LV-CMOS region 90 includes an n-type LV-nMOS 91 and a p-type LV-pMOS 92. The n-type LV-nMOS 91 and the p-type LV-pMOS 92 are separated from each other by the element separation portions 5 surrounding these MOSs 91 and 92 in rectangular forms. The LV-nMOS 91 and the LV-pMOS 92 are low-voltage elements whose rated voltage is, for example, less than 2V.

In a region for the LV-nMOS 91 and a region for the LV-pMOS 92, a deep n-type well 140 is formed along sides of the element separation portions 5 so as to cover these regions collectively. The deep n-type well 140 is formed with the same impurity concentration and the same depth as those of the n-type base region 54.

In an inner region of the deep n-type well 140 in the region for the LV-nMOS 91, a LV-p-type well 93 is formed along sides of the element separation portions 5 surrounding the region in a rectangular form. The LV-p-type well 93 is formed to be higher in impurity concentration than the p-type base region 43 and shallower than the p-type base region 43. For example, the LV-p-type well 93 is formed such that its bottom portion becomes the same in depth position as the bottom portion of the trench 10.

In an inner region of the LV-p-type well 93, a LV-n-type source region 94 and a LV-n-type drain region 95 are formed at an interval from each other along the front surface of the semiconductor substrate 2. The region between the LV-n-type source region 94 and the LV-n-type drain region 95 serves as a channel region of the LV-p-type well 93.

At the front surface of the semiconductor substrate 2 in the region for the LV-nMOS 91, a LV-nMOS gate insulating film 97 is formed. The LV-nMOS gate insulating film 97 is formed thinner still than the above-described MV-nMOS gate insulating film 77. Its thickness is, for example, 23 Å to 25 Å. Moreover, in such a manner so as to be opposed to the channel region of the LV-nMOS 91, a LV-nMOS gate electrode 98 is formed with the LV-nMOS gate insulating film 97 sandwiched therebetween. On a front surface of the LV-nMOS gate electrode 98, a silicide 96 is formed. Also, the LV-n-type source region 94 and the LV-n-type drain region 95 are formed in a self-aligned manner with respect to the LV-nMOS gate electrode 98. Also, both side faces of the LV-nMOS gate electrode 98 are covered with sidewalls 99 made of an insulating material such as silicon nitride.

Moreover, in inner regions of the LV-n-type source and drain regions 94 and 95, a LV-n-type source contact region 100 and a LV-n-type drain contact region 34 are formed respectively in a self-aligned manner with respect to the sidewalls 99. Also, on front surfaces of the LV-n-type source and drain contact regions 100 and 34, silicides are respectively formed.

In an inner region of the deep n-type well 140 in the region for the LV-pMOS 92, a LV-n-type well 101 is formed along sides of the element separation portions 5 surrounding the region in a rectangular form. The LV-n-type well 101 is formed to be higher in impurity concentration than the n-type base region 54 and shallower than the n-type base region 54. For example, the LV-n-type well 101 is formed such that its bottom portion becomes the same in depth position as the bottom portion of the trench 10.

In an inner region of the LV-n-type well 101, a LV-p-type source region 102 and a LV-p-type drain region 103 are formed at an interval from each other along the front surface of the semiconductor substrate 2. The region between the LV-p-type source region 102 and the LV-p-type drain region 103 serves as a channel region of the LV-n-type well 101.

At the front surface of the semiconductor substrate 2 in the region for the LV-pMOS 92, a LV-pMOS gate insulating film 105 is formed. The LV-pMOS gate insulating film 105 is formed with the same thickness and the same material as those of the LV-nMOS gate insulating film 97. Moreover, in such a manner so as to be opposed to the channel region of the LV-pMOS 92, a LV-pMOS gate electrode 106 is formed with the LV-pMOS gate insulating film 105 sandwiched therebetween. On a front surface of the LV-pMOS gate electrode 106, a silicide 104 is formed. Also, the LV-p-type source region 102 and the LV-p-type drain region 103 are formed in a self-aligned manner with respect to the LV-pMOS gate electrode 106. Also, both side faces of the LV-pMOS gate electrode 106 are covered with sidewalls 107 made of an insulating material such as silicon nitride.

Moreover, in inner regions of the LV-p-type source and drain regions 102 and 103, a LV-p-type source contact region 108 and a LV-p-type drain contact region 109 are formed respectively in a self-aligned manner with respect to the sidewalls 107. Also, on front surfaces of the LV-p-type source and drain contact regions 108 and 109, silicides are respectively formed.

Further, an interlayer insulating film 110 is stacked on the semiconductor substrate 2 so as to cover the memory cell region 3 and the CMOS region 4 described above. The interlayer insulating film 110 is made of, for example, an insulating material such as silicon oxide.

On the interlayer insulating film 110, a plurality of wirings 111 made of a conducting material such as aluminum are formed. The plurality of wirings 111 are respectively connected, via contact plugs 113 that penetrate through the interlayer insulating film 110, to the n-type source region 23, the n-type drain region 24, the HV-n-type source contact region 47, the HV-n-type drain contact region 48, the HV-p-type source contact region 58, the HV-p-type drain contact region 59, the MV-n-type source contact region 80, the MV-n-type drain contact region 33, the MV-p-type source contact region 88, the MV-p-type drain contact region 89, the LV-n-type source contact region 100, the LV-n-type drain contact region 34, the LV-p-type source contact region 108, and the LV-p-type drain contact region 109.

Moreover, on the interlayer insulating film 110, a surface protective film 118 made of an insulating material such as silicon nitride is formed so as to coat the respective wirings 111.

Operations of writing, erasing, and reading of information with respect to the nonvolatile memory cell 20 can be performed in the following manner.

As an injection of electrons into the floating gate 26, for example, when a positive voltage is applied to the control gate 27 and the n-type drain region 24 with the n-type source region 23 provided at a ground potential, electrons are injected into the floating gate 26 by FN tunneling via the tunneling oxide film 37 from the n-type source region 23.

As a removal of electrons from the floating gate 26, for example, when a negative voltage is applied to the control gate 27 and a positive voltage is applied to the n-type source region 23 with the n-type drain region 24 opened, electrons are removed toward the n-type source region 23 by FN tunneling via the tunneling oxide film 37 from the floating gate 26.

When electrons are injected into the floating gate 26, in a state where the floating gate 26 is charged, a high threshold voltage needs to be applied to the control gate 27 in order to make the nonvolatile memory cell 20 conduct. Therefore, a reading voltage that needs to be supplied to the control gate 27 is set in advance to a value at which the section between the n-type source region 23 and the n-type drain region 24 is kept in a blocked state when the floating gate 26 is in an uncharged state (state in which electrons have been removed) and the section between the n-type source region 23 and the n-type drain region 24 can be made to conduct when the floating gate 26 is in a charged state (state in which electrons have been injected). At this time, checking whether a current flows to the source side allows to discriminate whether electrons are being injected into the floating gate 26. In this manner, the operations of writing, erasing, and reading of information with respect to the nonvolatile memory cell 20 can be performed.

Next, characteristics of writing, erasing, and reading of information with respect to the nonvolatile memory cell 20 will be described based on a coupling ratio that can be derived from an arrangement of the floating gate 26 and the element separation portions 5.

Figure 4:
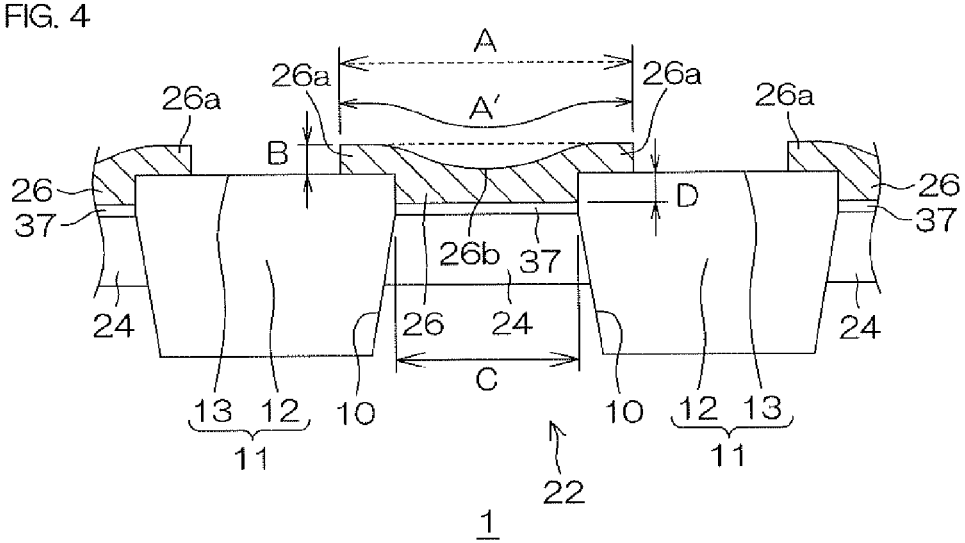
FIG. 4 is a sectional view of the semiconductor device for explaining a coupling ratio.
Figure 5A:
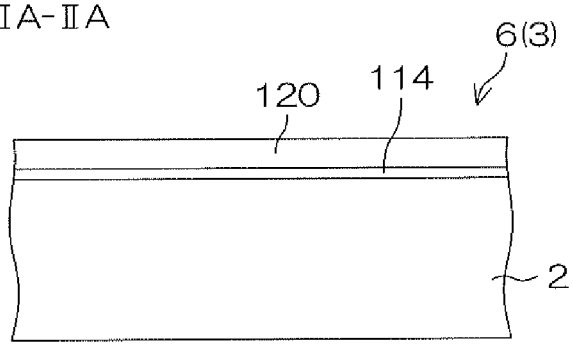
Figure 5B:
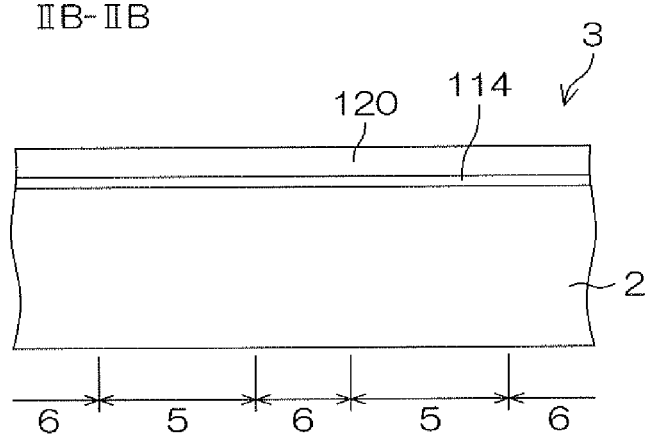
Figure 6A:
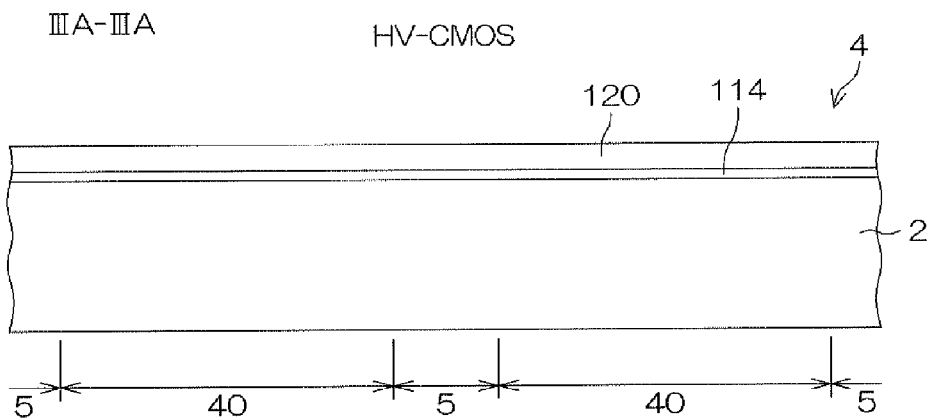
Figure 6B:
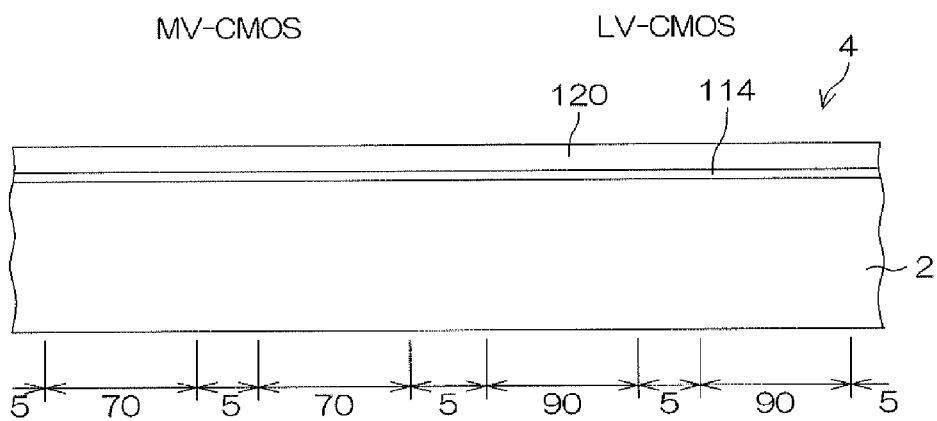
Figure 7A:
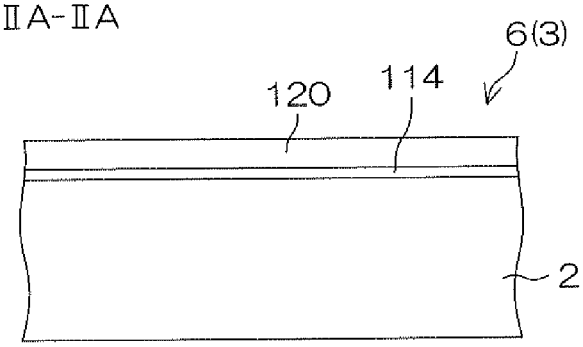
Figure 7B:
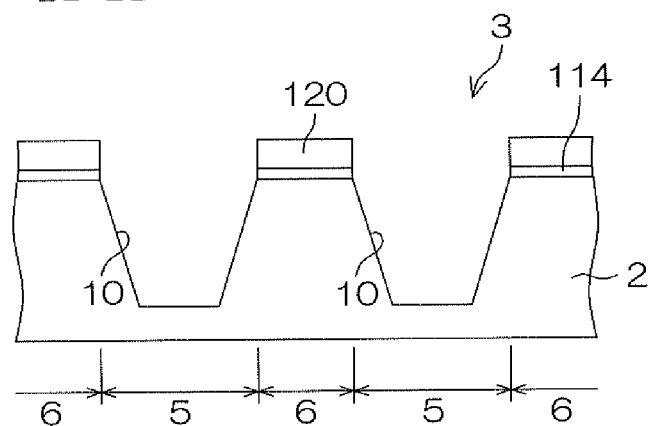
Figure 8A:
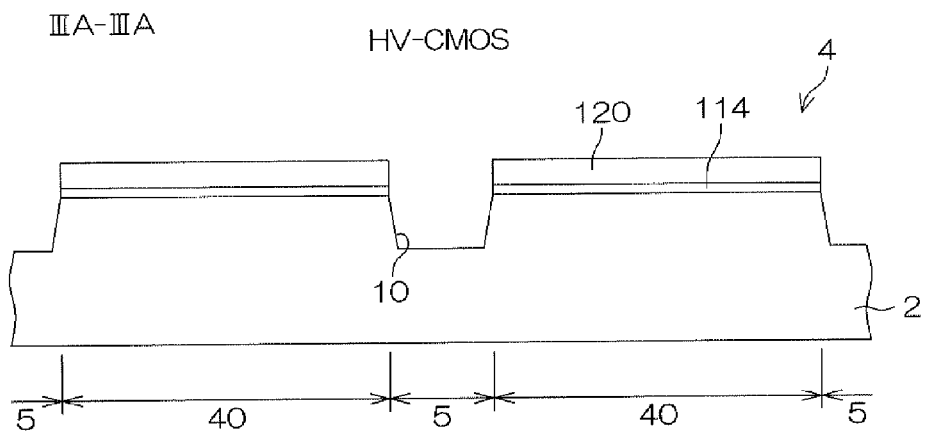
Figure 8B:
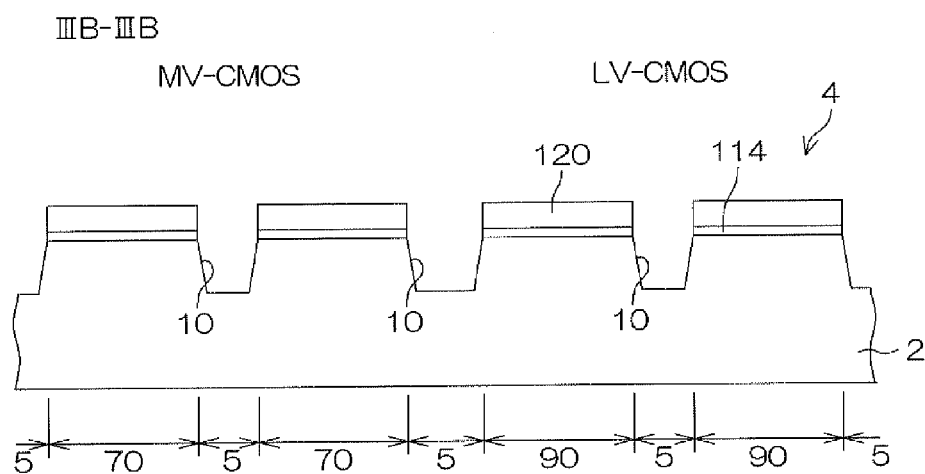
Figure 9A:
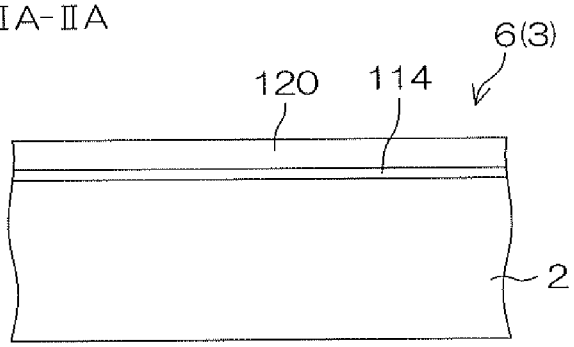
Figure 9B:
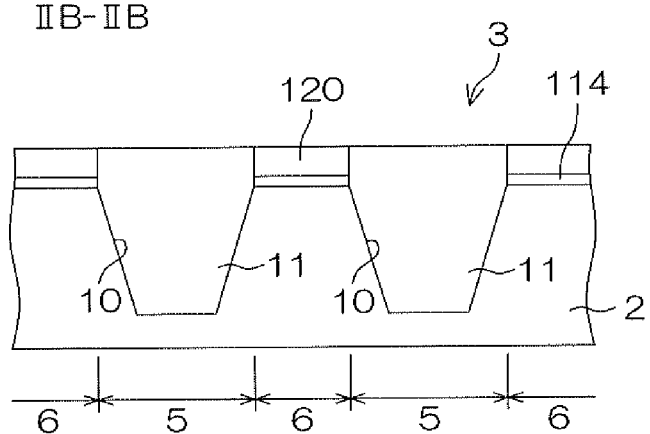
Figure 10A:
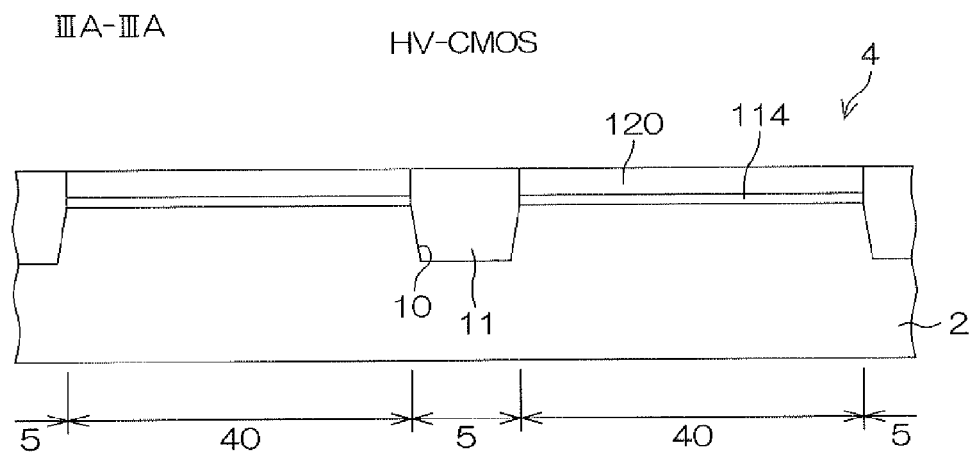
Figure 10B:
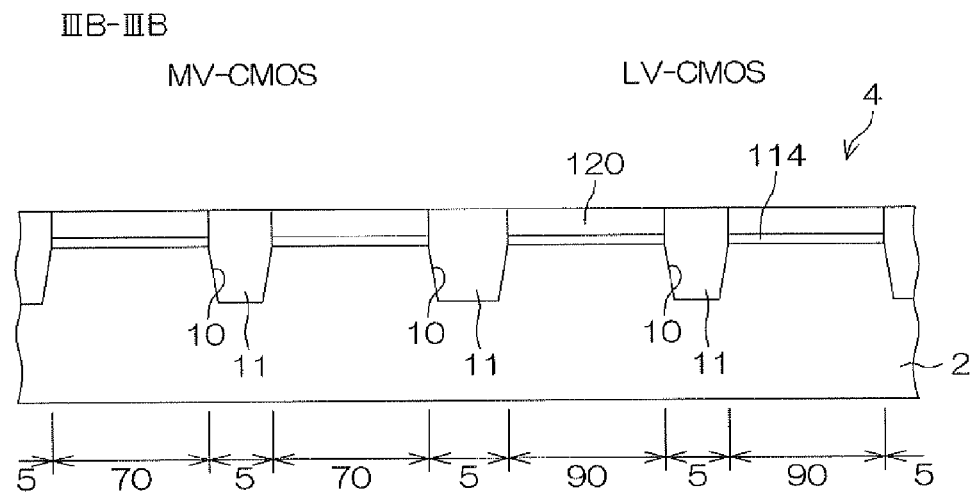
Figure 11A:
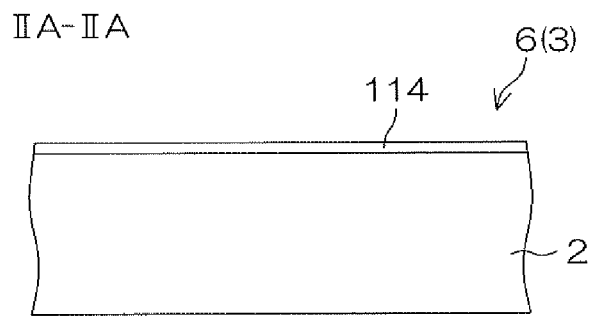
Figure 11B:
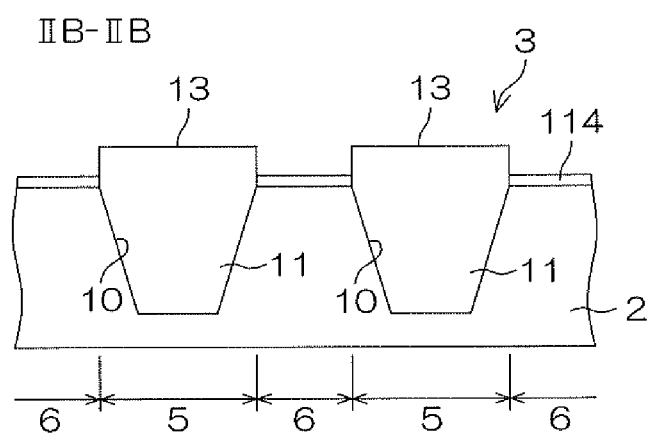
Figure 12A:
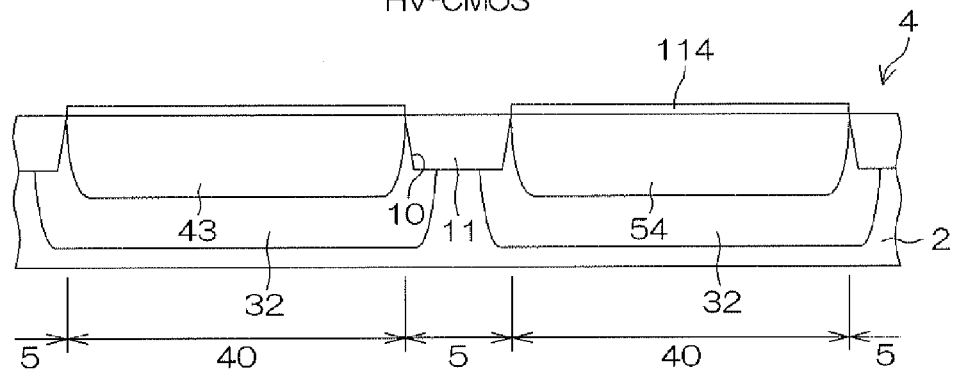
Figure 12B:
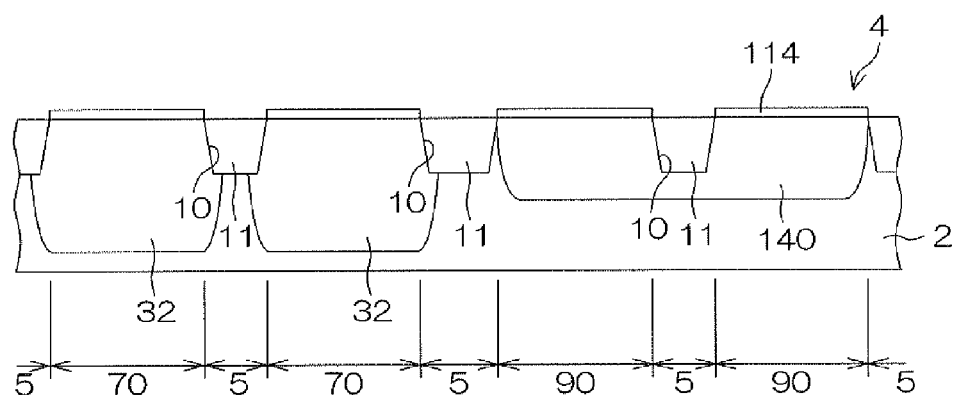
Figure 13A:
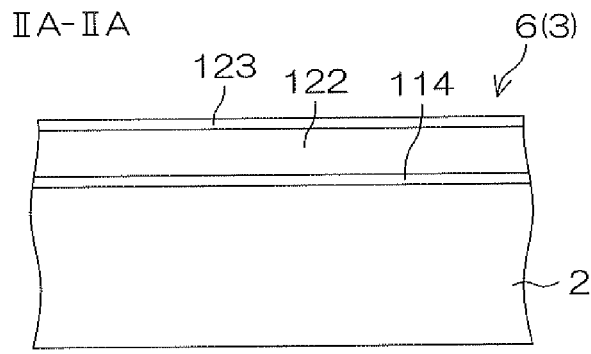
Figure 13B:
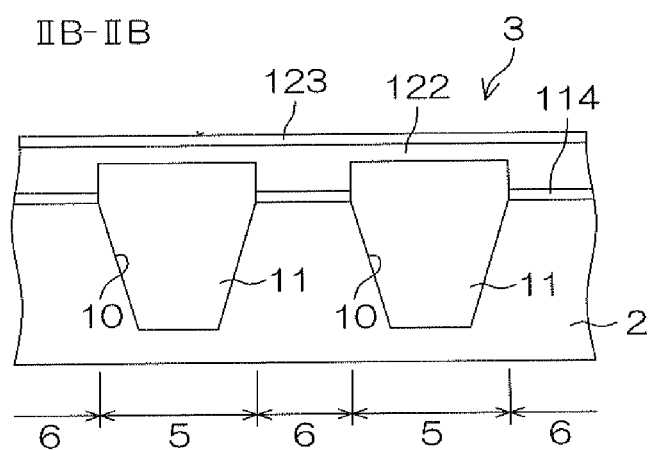
Figure 14A:
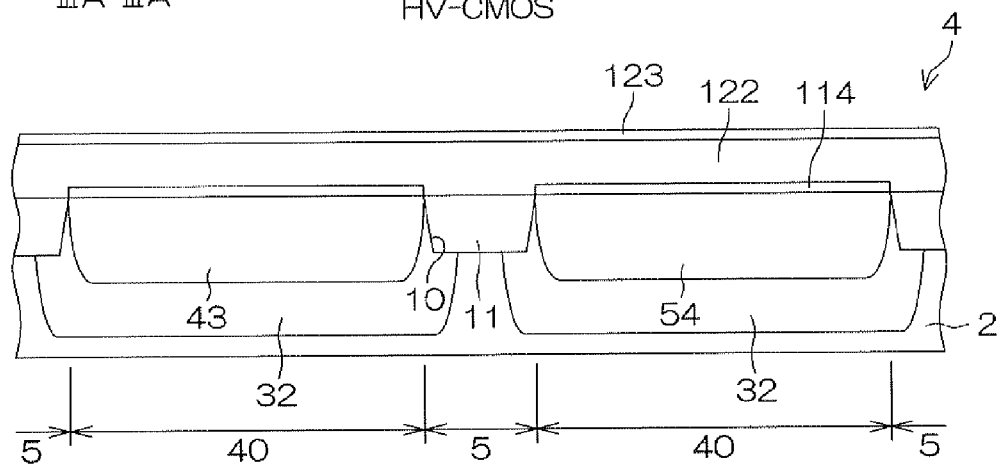
Figure 14B:
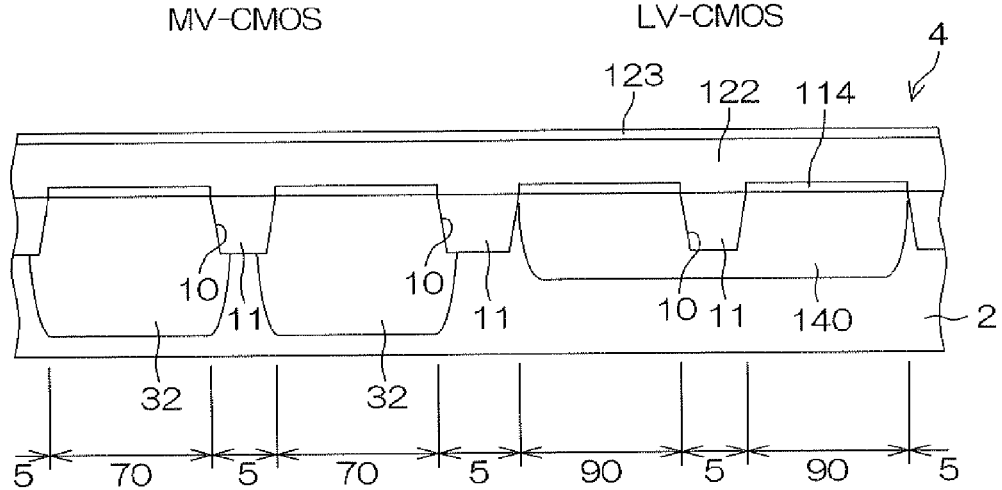
Figure 15A:
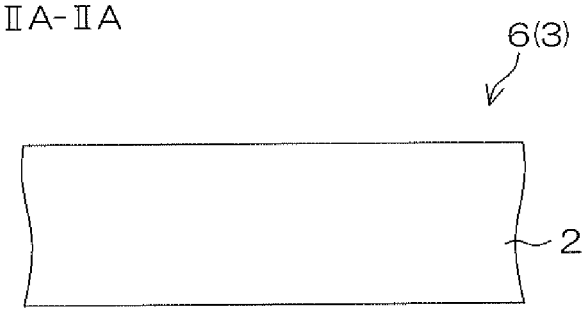
Figure 15B:
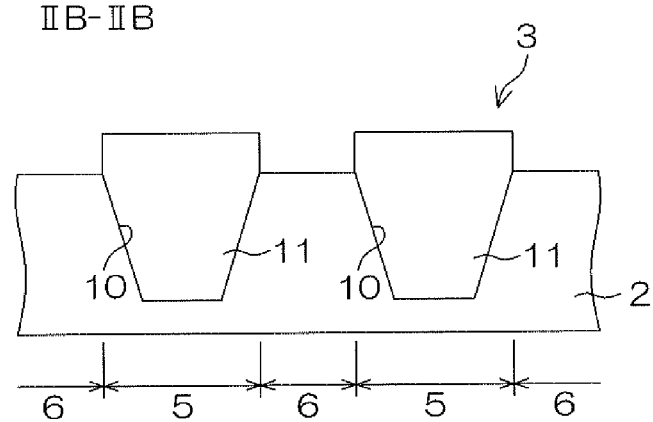
Figure 16A:
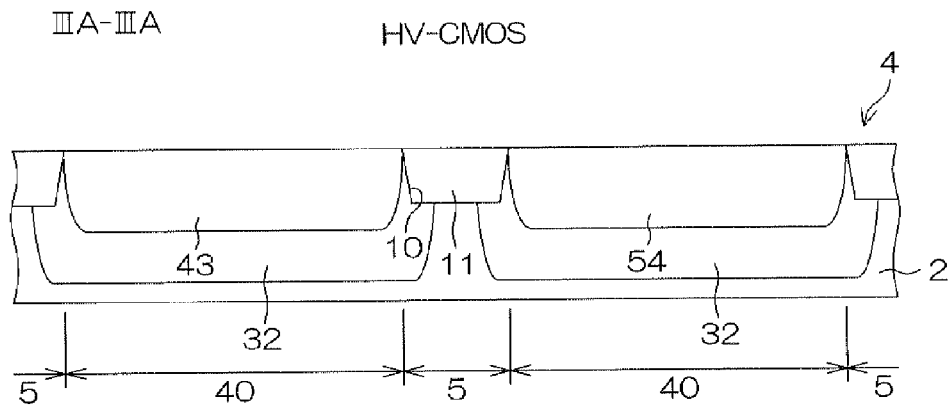
Figure 16B:
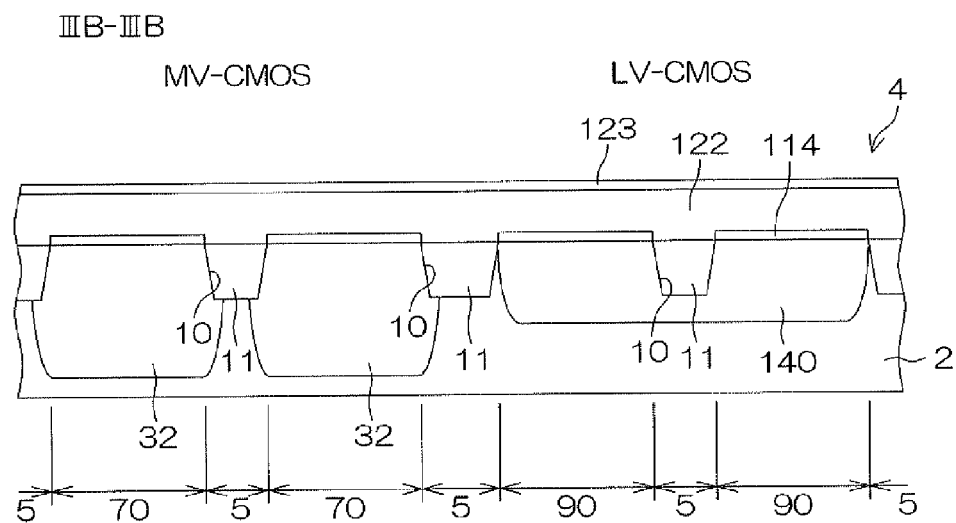
Figure 17A:
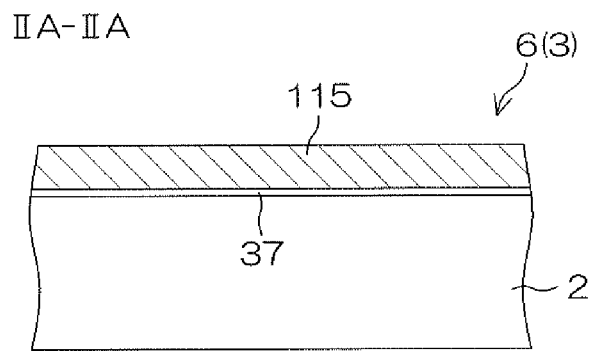
Figure 17B:
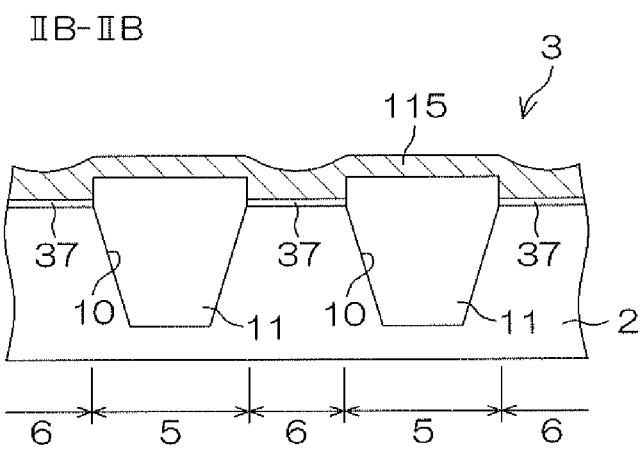
Figure 18A:
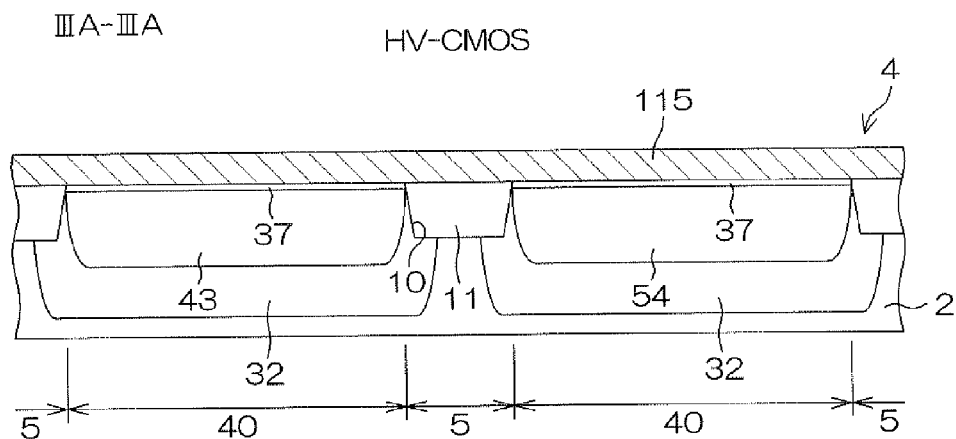
Figure 18B:
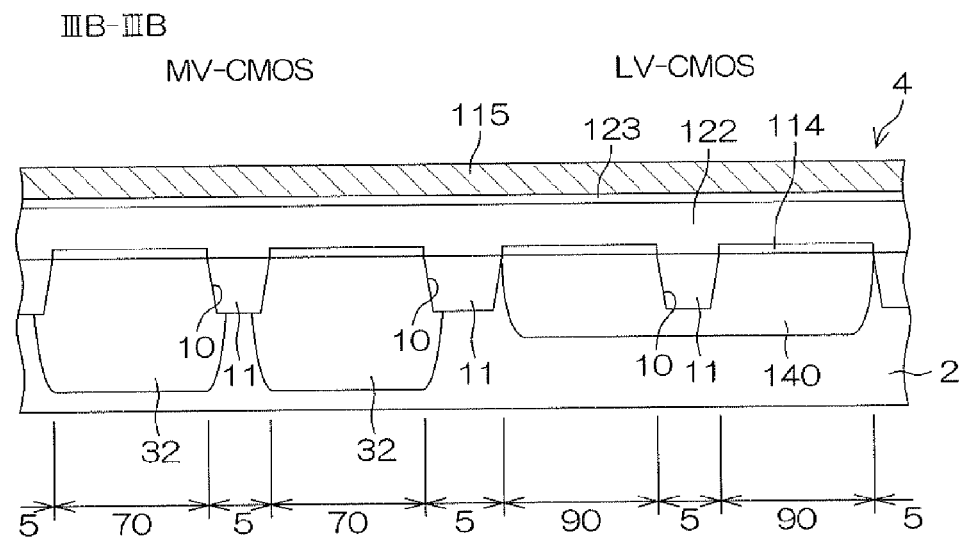
Figure 19A:
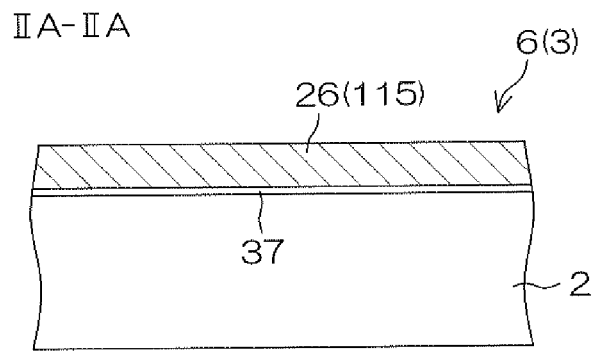
Figure 19B:
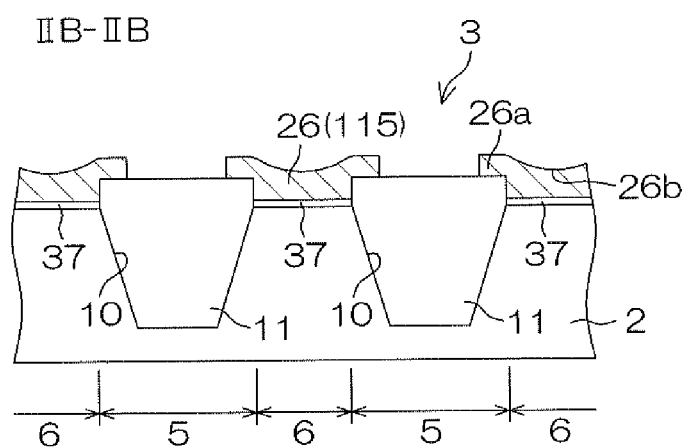
Figure 20A:
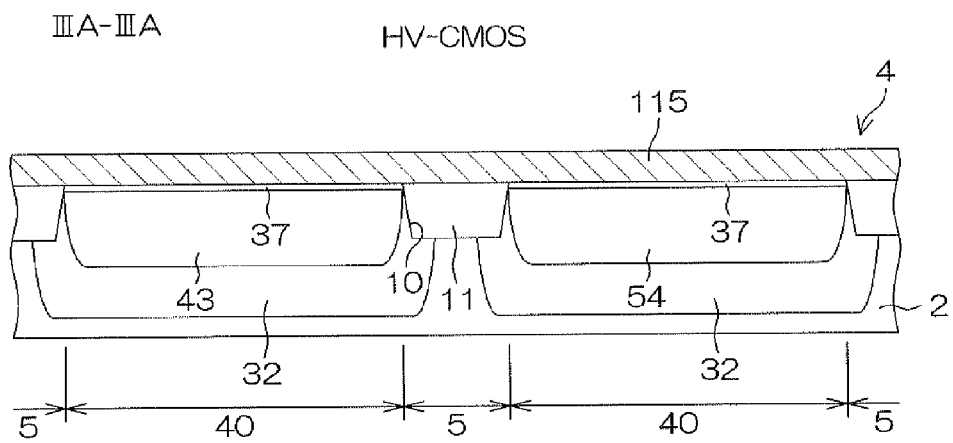
Figure 20B:
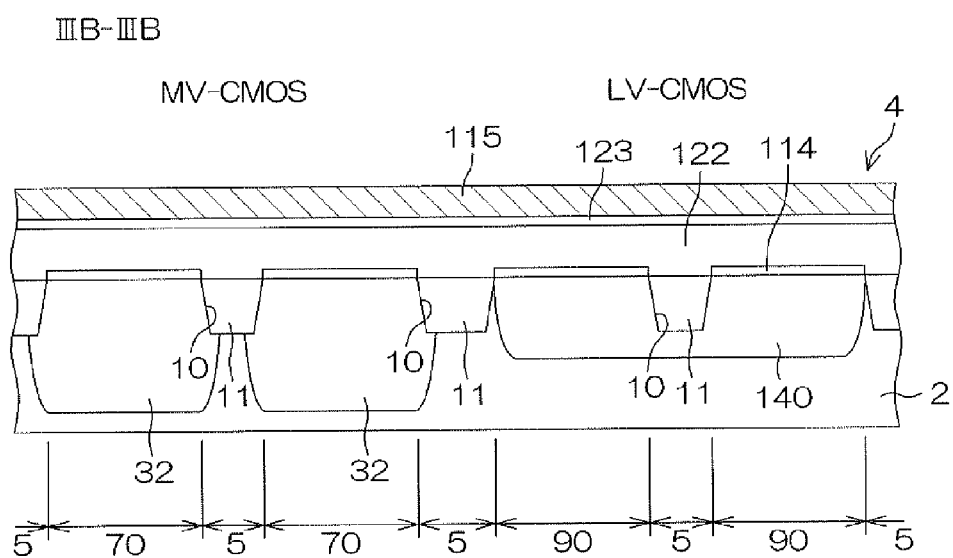
Figure 21A:
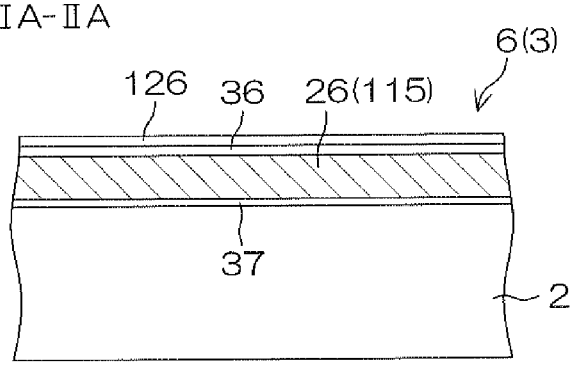
Figure 21B:
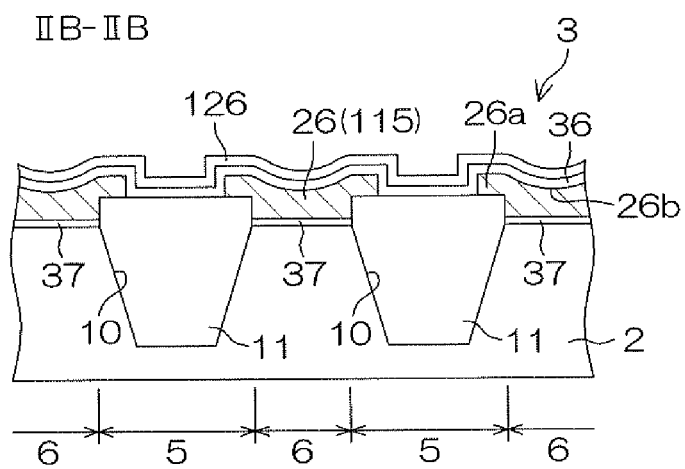
Figure 22A:
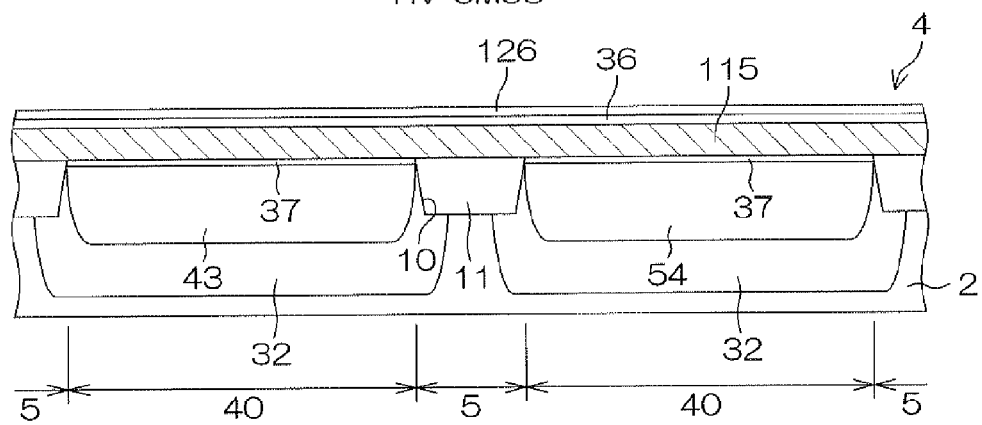
Figure 22B:
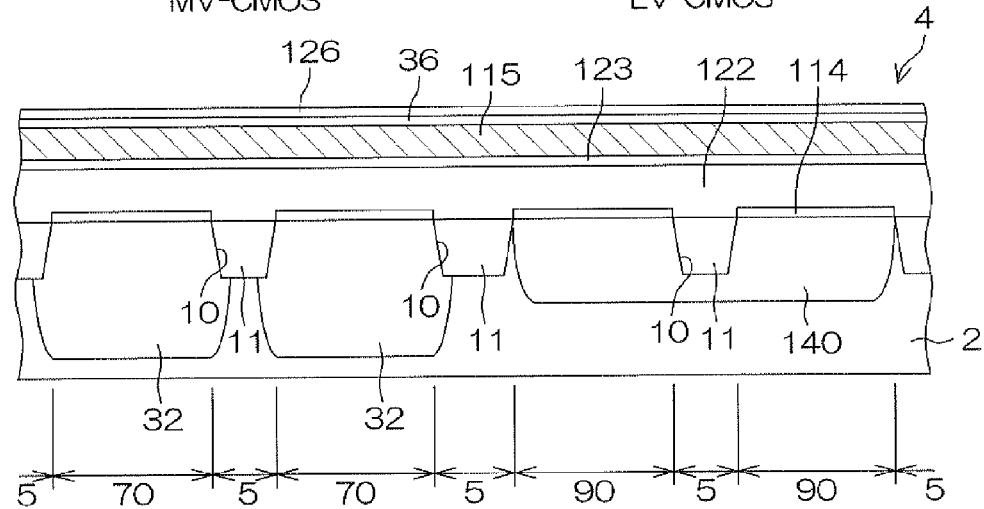
Figure 23A:
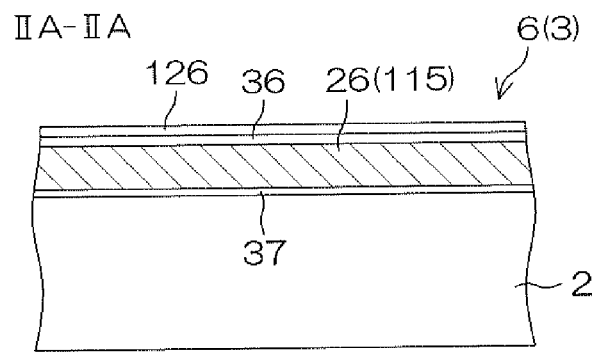
Figure 23B:
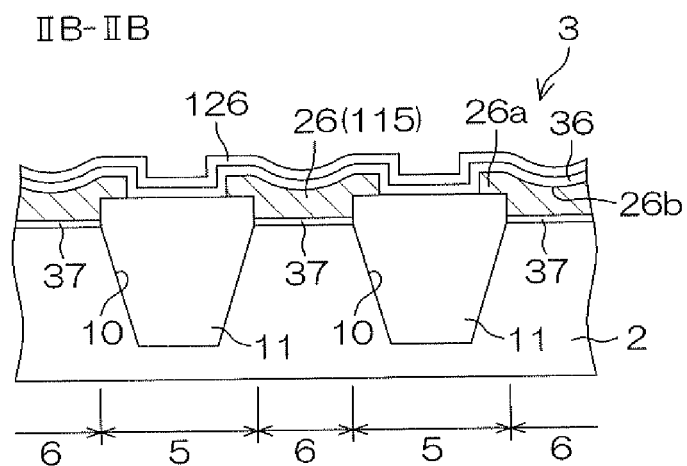
Figure 24A:
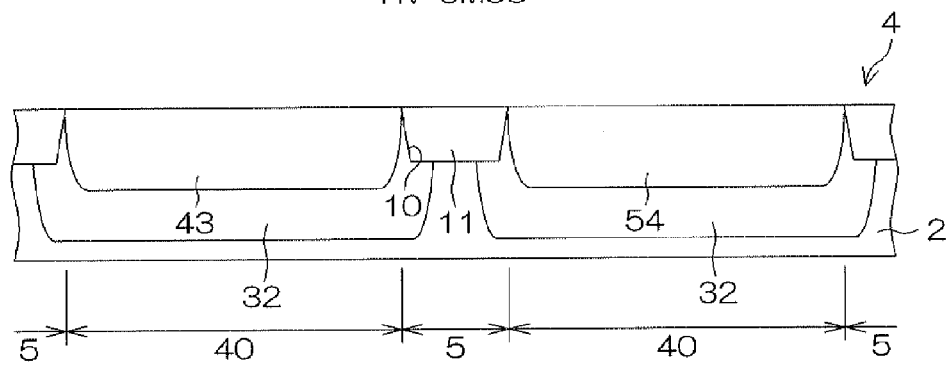
Figure 24B:
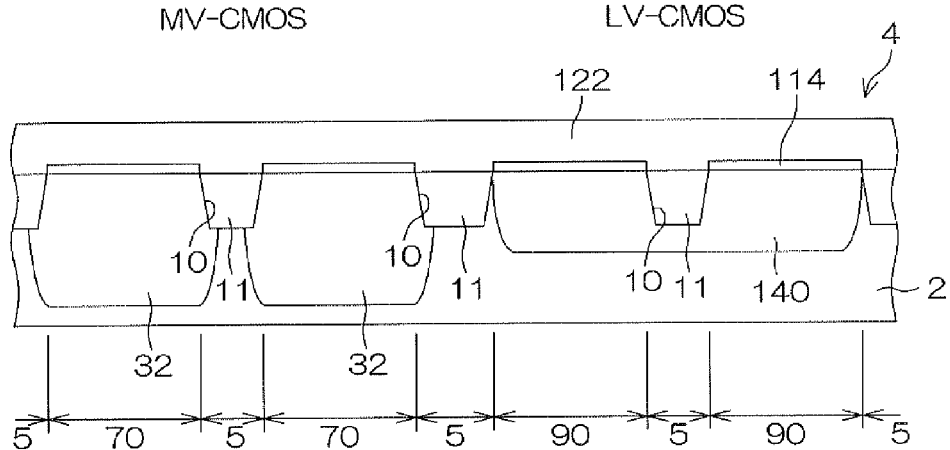
Figure 26A:
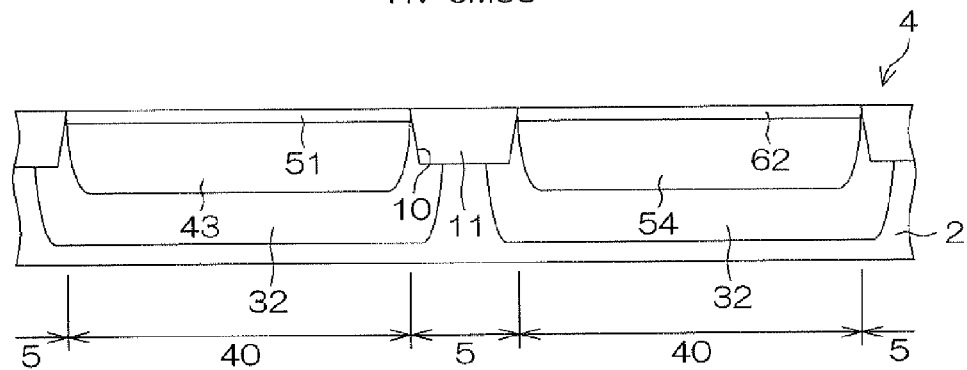
Figure 26B:
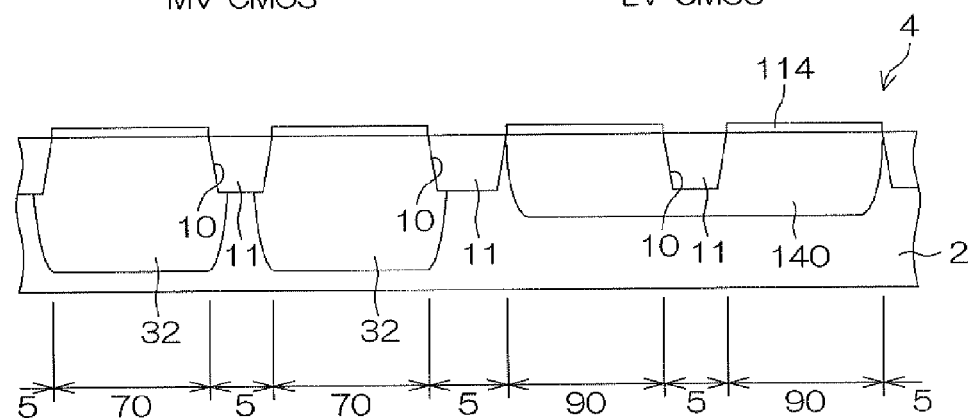
Figure 27A:
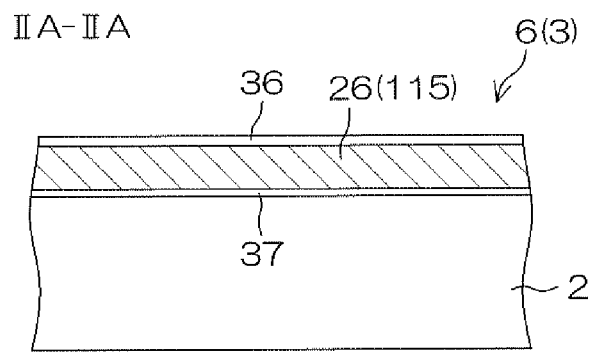
Figure 27B:
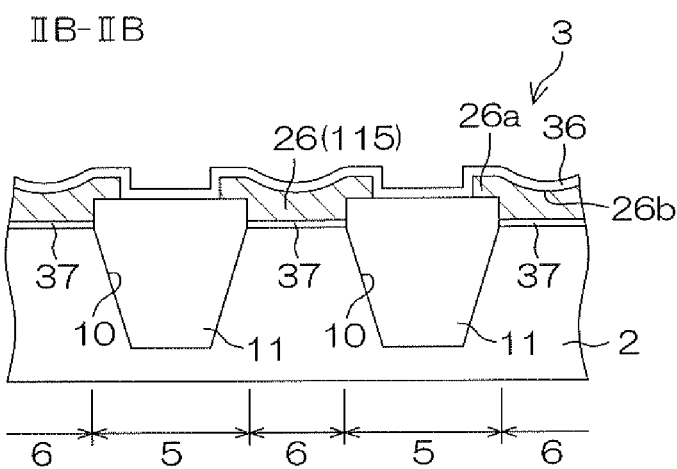
Figure 28A:
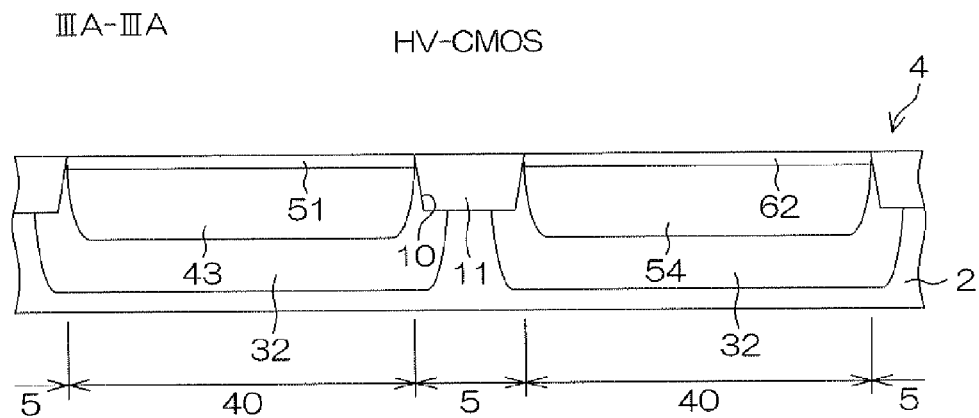
Figure 28B:
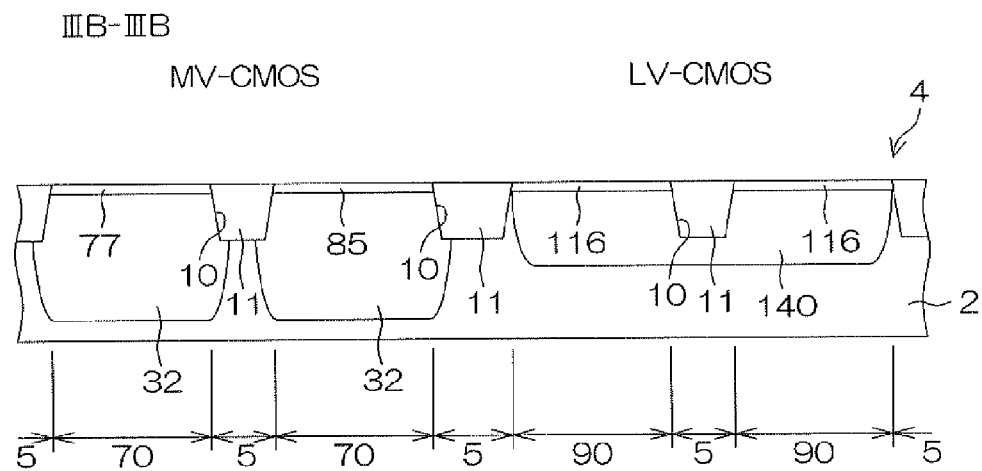
Figure 29A:
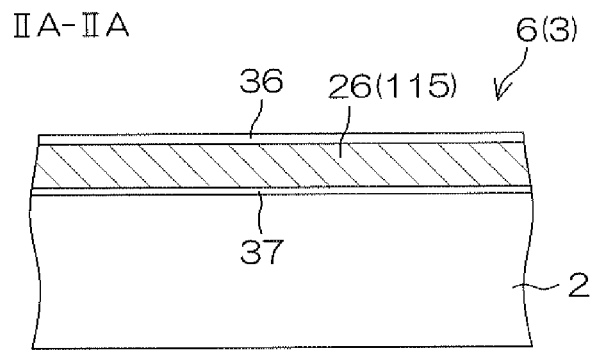
Figure 29B:
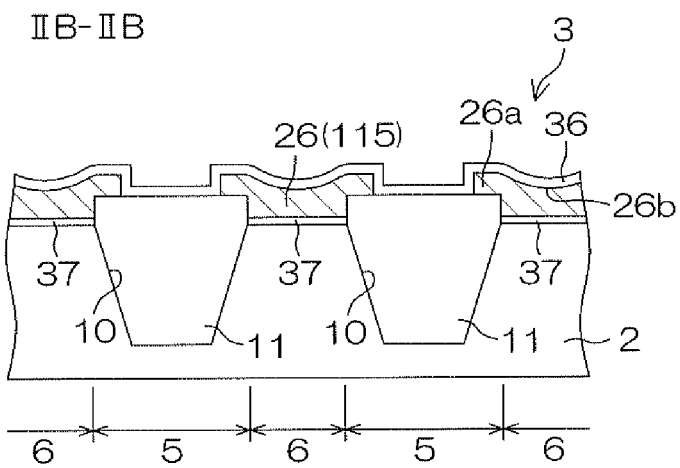
Figure 30A:
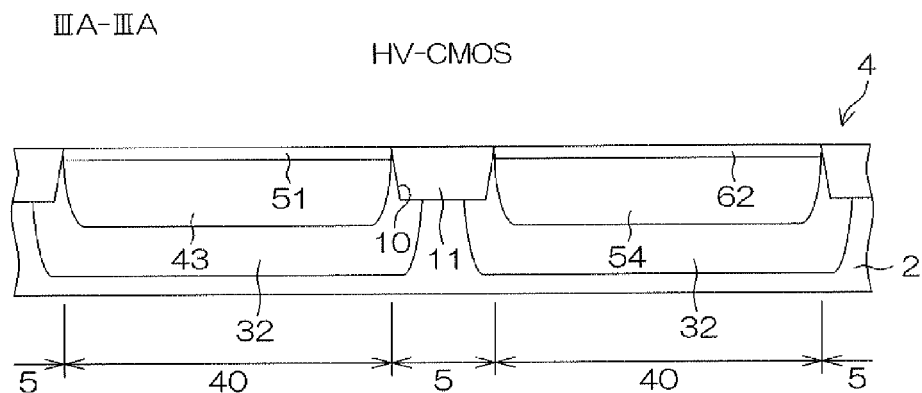
Figure 30B:
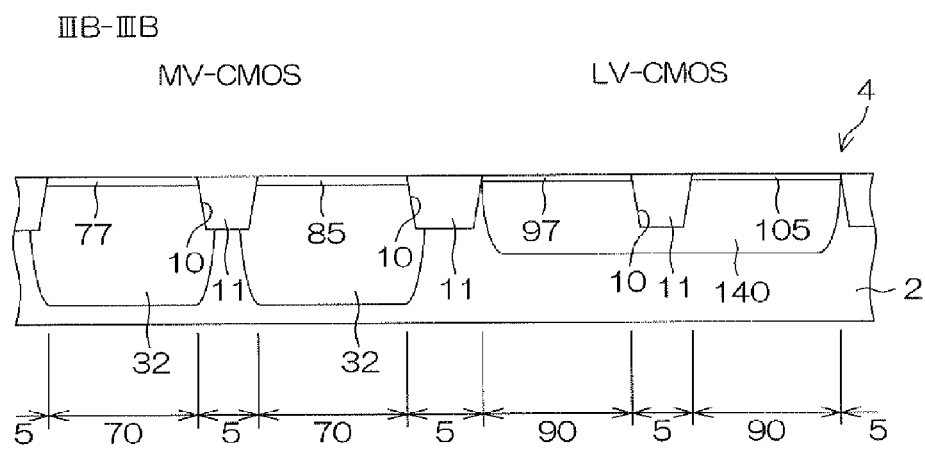
Figure 31A:
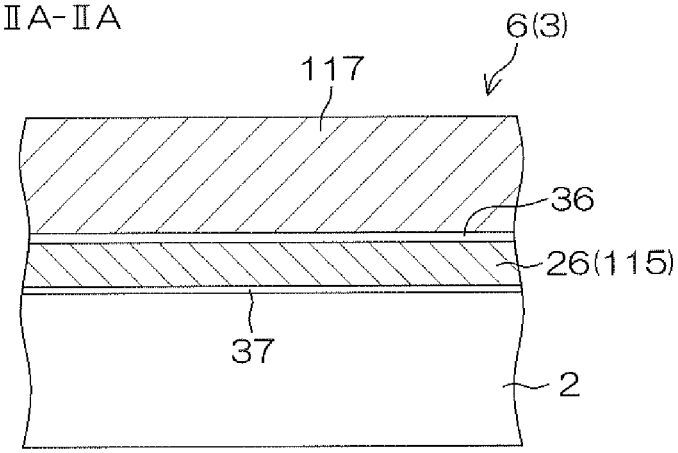
Figure 31B:
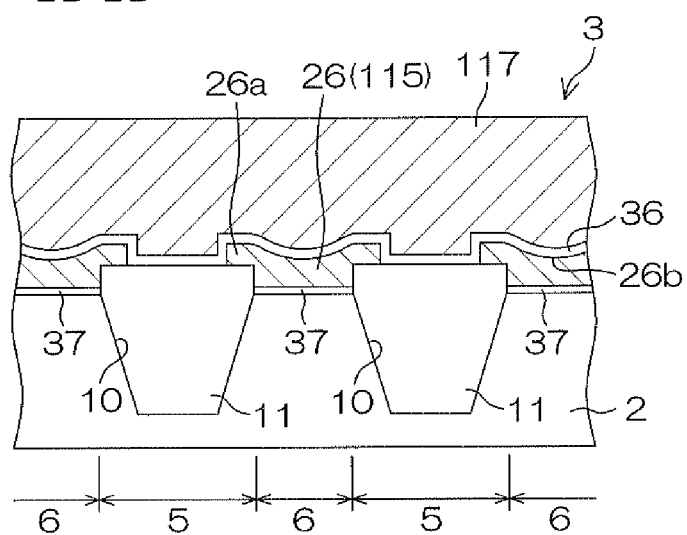
Figure 32A:
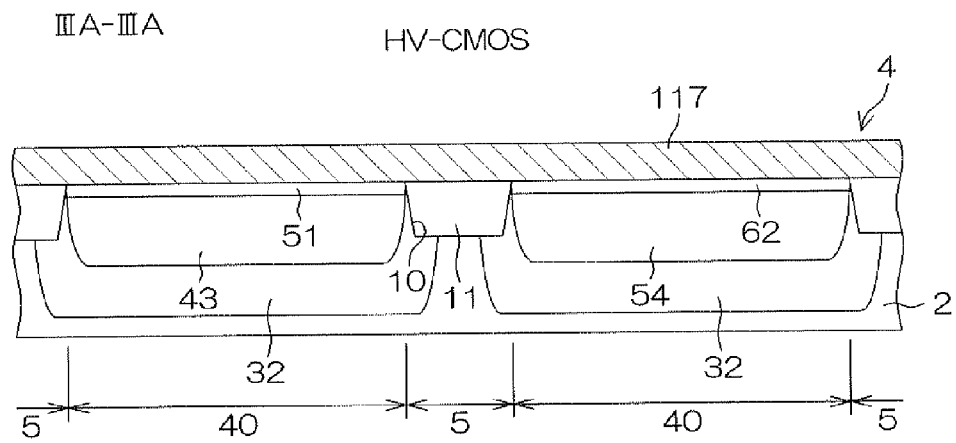
Figure 32B:
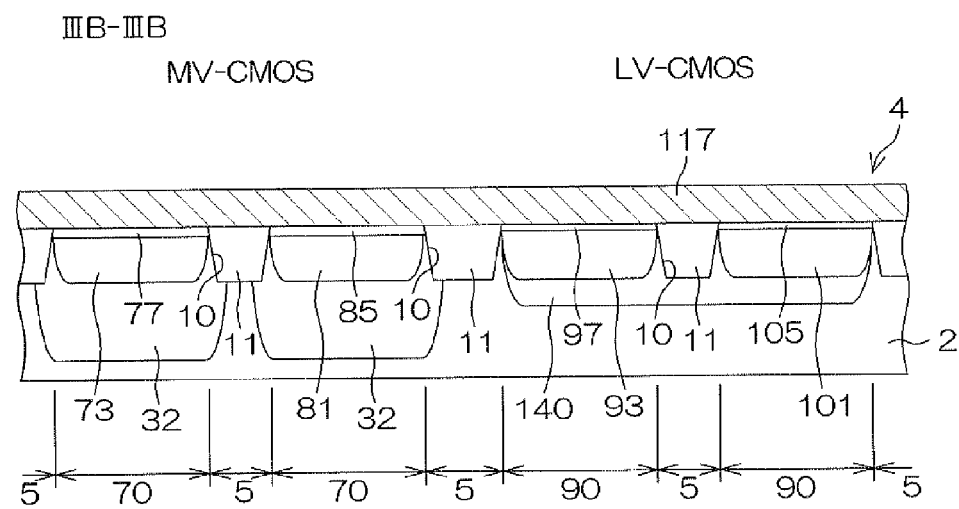
Figure 33A:
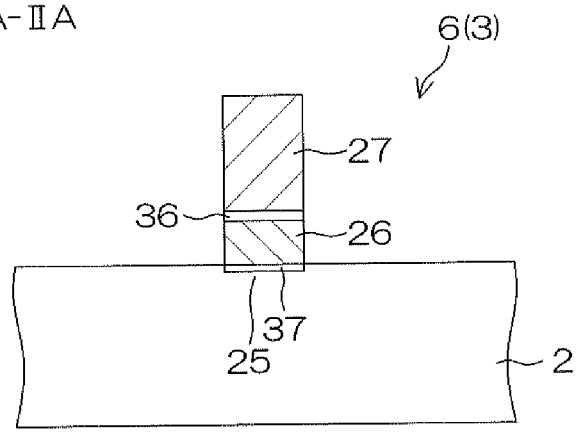
Figure 33B:
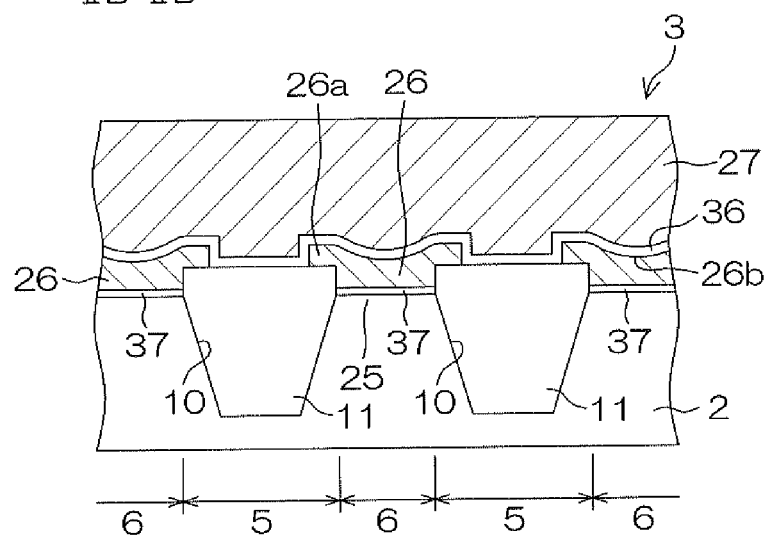
Figure 34A:
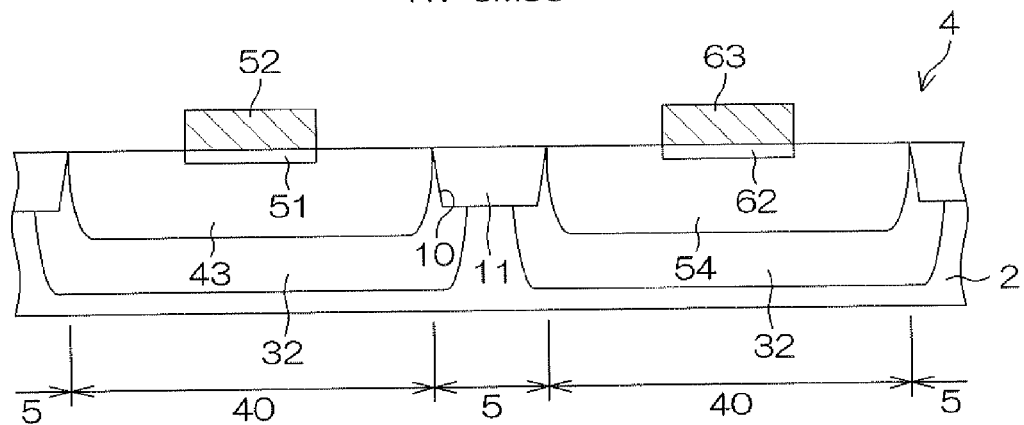
Figure 34B:
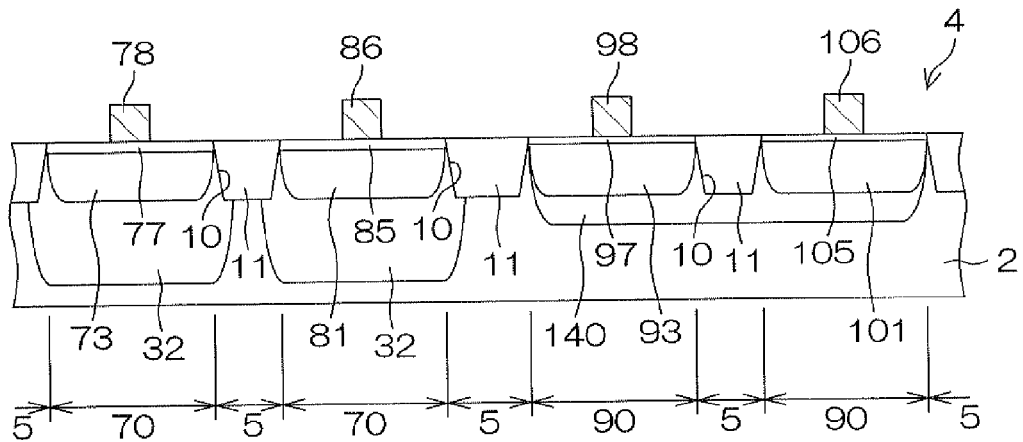
Figure 35A:
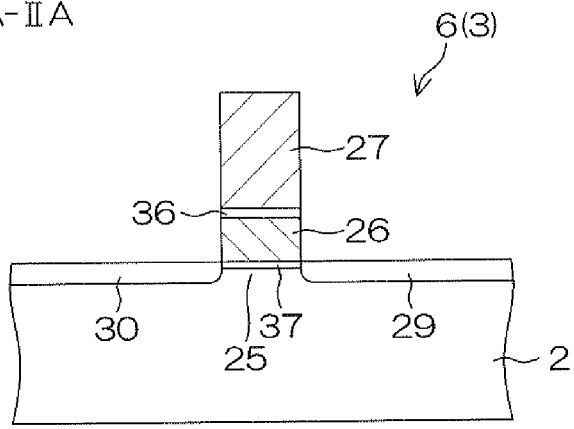
Figure 35B:
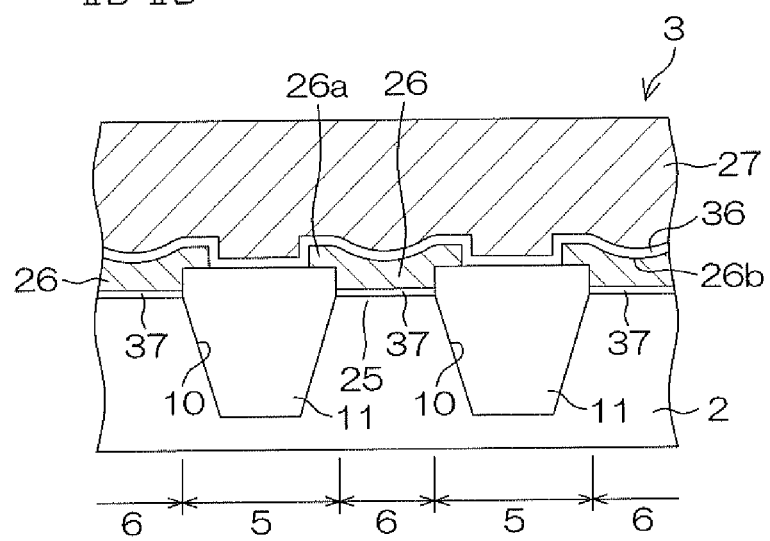
Figure 36A:
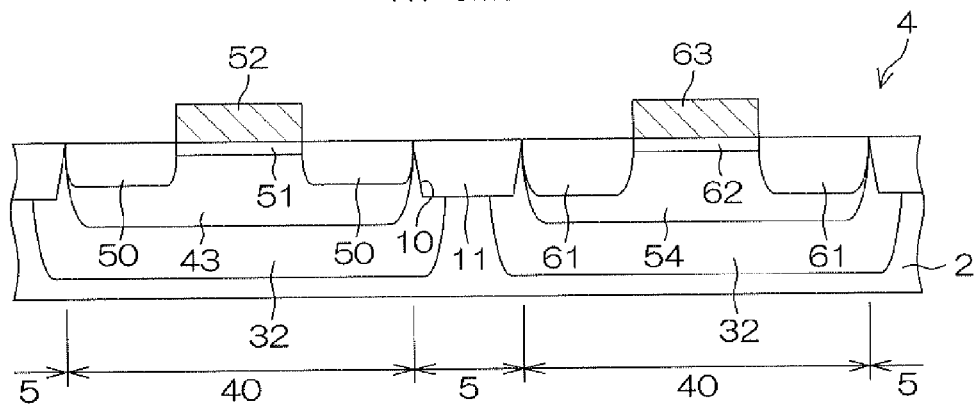
Figure 36B:
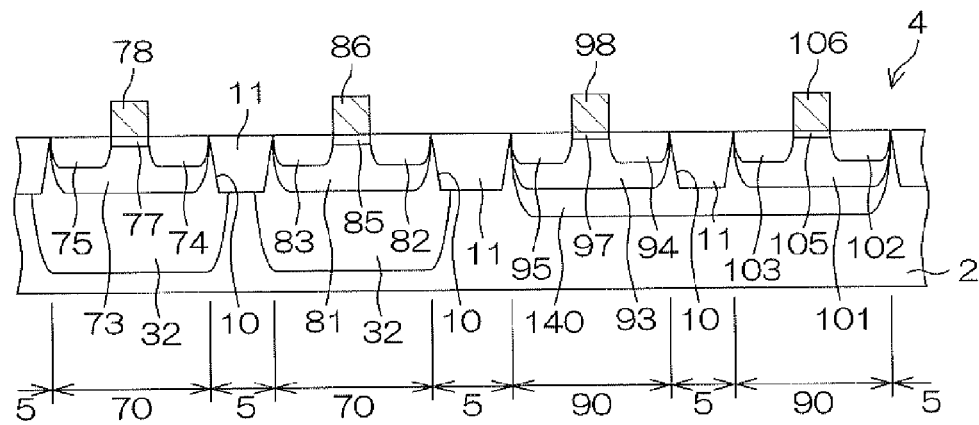
Figure 37A:
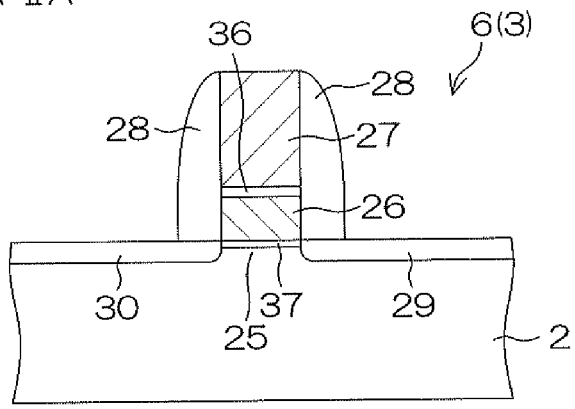
Figure 37B:
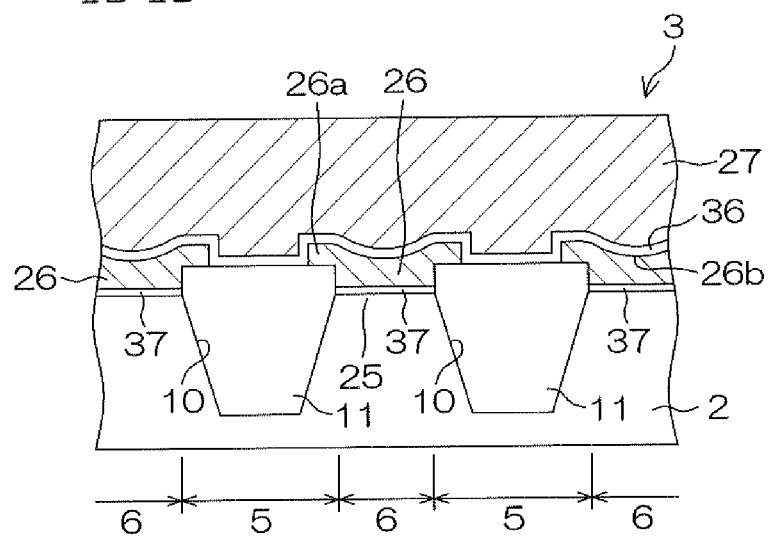
Figure 38A:
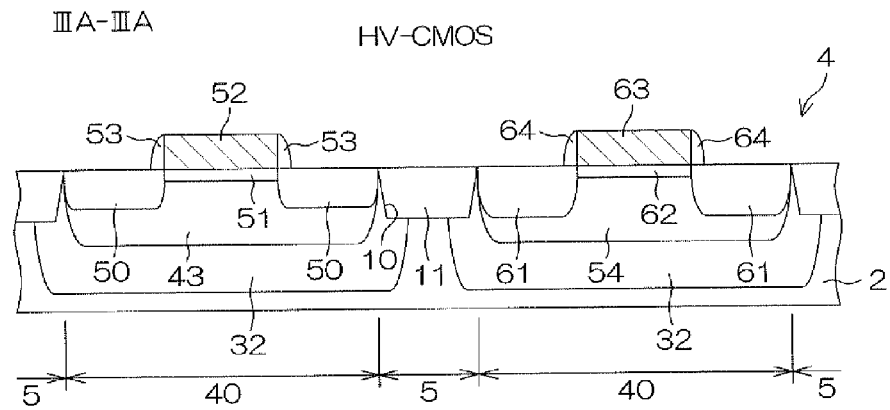
Figure 38B:
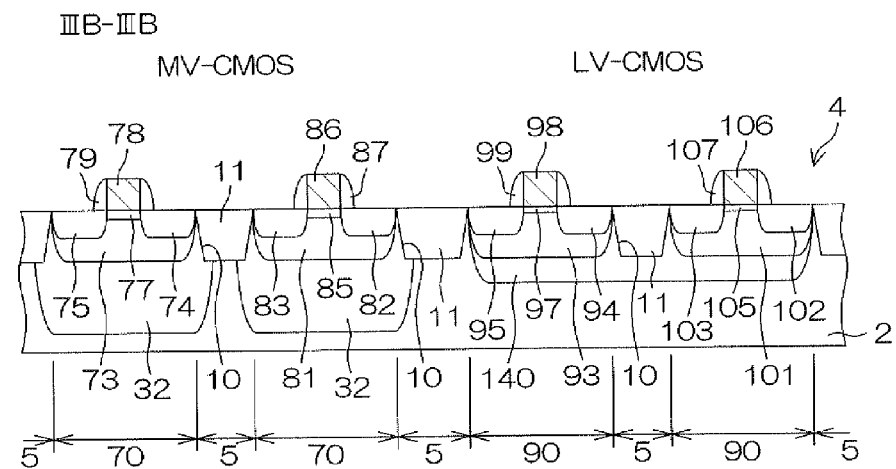
Figure 39A:
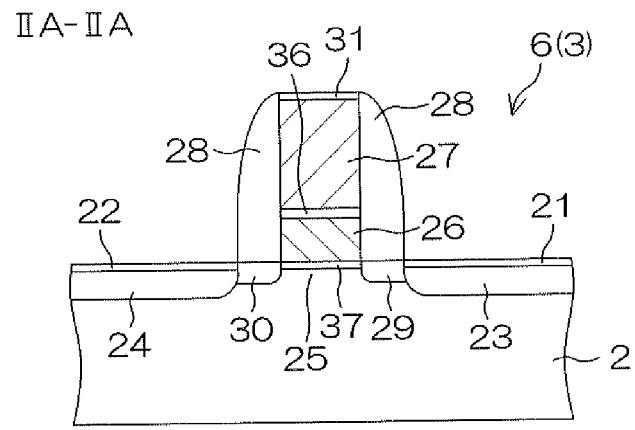
Figure 39B:
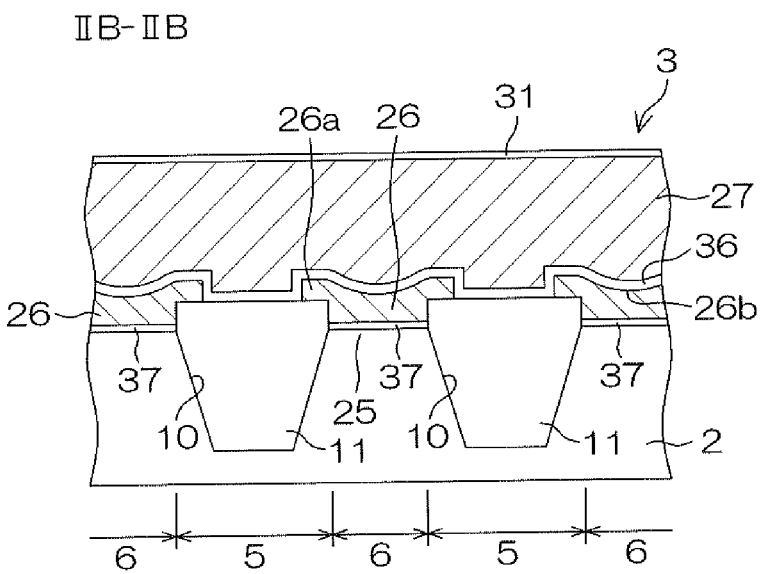
Figure 40A:
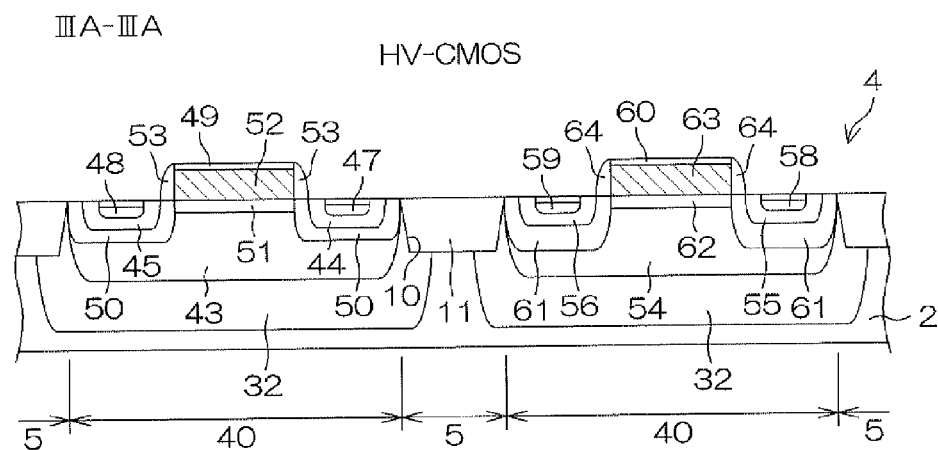
Figure 40B:
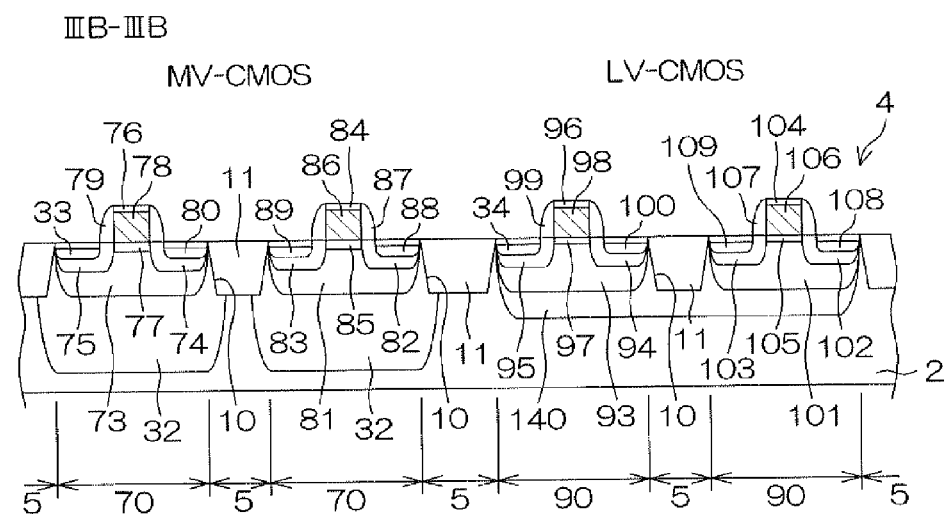

FIG. 4 is a sectional view of the semiconductor device 1 for explaining the coupling ratio.

As shown in FIG. 2B, in the nonvolatile memory cell 20 of the present embodiment, the floating gate 26 is made into a recessed shape to form a concave surface by making both end portions (overlapping parts 26a) of the floating gate 26 overlap the projecting parts 13 of the buried insulating film 11. This arrangement enhances the coupling ratio of the memory cell 20.

For example, according to the conventional arrangement, because the buried insulating film 11 is almost completely buried into the trench 10 formed in the semiconductor substrate 2, no projecting part 13 is formed in the buried insulating film 11. That is, a projection amount D of the buried insulating film 11 with respect to the semiconductor substrate 2 is nearly zero (namely, D≈0 in FIG. 4). At this time, a conventional coupling ratio Z can be expressed as in the following formula (1), using x as a constant of the coupling ratio, where A represents the dimension (surface distance between both ends in the width direction) of the floating gate 26, B represents the film thickness of the floating gate 26, and C represents the width of the active region 6.

$$Z = x(A + 2B)/C \quad (1)$$

In contrast, according to the arrangement of the present embodiment, the buried insulating film 11 projecting with the projection amount D to the extent so as to form a concave surface in the floating gate 26 is formed. Accordingly, the top face of the floating gate 26 becomes a concave surface so as to secure a longer dimension than the dimension A of the conventional floating gate 26. That is, the coupling ratio Z' can be expressed as in the following formula (2) where A' represents the dimension of the floating gate 26 of the present embodiment.

$$Z' = x(A' + 2B)/C \quad (2)$$

A comparison of the formula (1) and formula (2) mentioned above shows that the dimension A' of the floating gate 26 of the present embodiment is greater than the dimension A of the conventional floating gate 26 (that is, A'>A), so that the coupling ratio Z' of the present embodiment has a value greater than that of the conventional coupling ratio Z (that is, Z'>Z).

Thus, in the nonvolatile memory cell 20, forming the floating gate 26 having a concave surface allows an increase in the surface area of the floating gate 26 to improve the coupling ratio without being subjected to the limitation of design rules in design. That is, the coupling ratio of the floating gate 26 can be enhanced regardless of the width C of the active region 6. As a result, characteristics of the writing speed and erasing speed of the semiconductor device 1 can be enhanced.

Also, because the plurality of floating gates 26 share the element separation portion 5, the nonvolatile memory cell 20 can also be miniaturized.

Next, a manufacturing process of the semiconductor device 1 will be described with reference to FIGS. 5A and 5B to FIGS. 40A and 40B.

FIGS. 5A and 5B to FIGS. 40A and 40B are sectional views for explaining in the order of steps an example of the manufacturing process of the semiconductor device 1 of the present invention. Among FIGS. 5A and 5B to FIGS. 40A and 40B, drawings with odd numbers such as FIGS. 5A and 5B, FIGS. 7A and 7B, and FIGS. 9A and 9B show steps of the memory region 3, and drawings with even numbers such as FIGS. 6A and 6B, FIGS. 8A and 8B, and FIGS. 10A and 10B show steps of the CMOS region 4.

For manufacturing the semiconductor device 1, as shown in FIGS. 5A and 5B and FIGS. 6A and 6B, a pad oxide film 114 is formed on the front surface of the semiconductor substrate 2 by, for example, a thermal oxidization method, and then, by, for example, a CVD method, a hard mask 120 as an example of a sacrificial film of the present invention is formed on the pad oxide film 114. The thickness of the pad oxide film 114 is, for example, on the order of 125 Å. Also, the hard mask 120 is formed of a silicon nitride film having a thickness, for example, on the order of 800 Å.

Next, as shown in FIGS. 7A and 7B and FIGS. 8A and 8B, the hard mask 120 and the pad oxide film 114 are selectively etched in order to selectively form openings in regions where trenches 10 need to be formed. Then, an etching gas is supplied to the semiconductor substrate 2 via the openings. The etching gas proceeds from said openings in a depth direction of the semiconductor substrate 2, so that trenches 10 having tapered forms in a sectional view are simultaneously formed in the memory cell region 3 and the CMOS region 4.

Next, as shown in FIGS. 9A and 9B and FIGS. 10A and 10B, said trenches 10 are filled back by deposition of silicon oxide. The deposition of silicon oxide is performed by, for example, a P-CVD (Plasma-Enhanced Chemical Vapor Deposition) method or a HDP-CVD (High-Density Plasma Chemical Vapor Deposition) method. Preferably, the HDP-CVD method is used. The trenches 10 and the openings in the hard mask 120 are filled back with silicon oxide, and further, the hard mask 120 is completely covered with silicon oxide.

Subsequently, an unnecessary part of said silicon oxide (part out of the trenches 10 and the openings in the hard mask 120) is removed by a CMP (Chemical Mechanical Polishing) method. The CMP is continued until a front surface of the hard mask 120 and a front surface (polished surface) of the buried oxide film become flush with each other. Accordingly, a buried insulating film 11 is buried so as to fill the trenches 10 and the openings in the hard mask 120, and element separation portions 5 are thereby formed. In this step, thin-filming by a RIE (Reactive Ion Etching) method and deposition by the P-CVD method or HDP-CVD method may be alternately repeated to deposit silicon oxide, in order to fill silicon oxide into the trenches 10 evenly and uniformly.

After formation of the element separation portions 5, as shown in FIGS. 11A and 11B and FIGS. 12A and 12B, in the memory cell region 3, the hard mask 120 is completely removed from over the pad oxide film 114 by etching or the like. Accordingly, a part of the buried insulating film 11 that has been buried into the openings in the hard mask 120 remains as projecting parts 13 that project with respect to a front surface of the pad oxide film 114 (semiconductor substrate 2). The remaining projecting parts 13 are formed so as to have side faces vertical to the front surface of the semiconductor substrate 2.

In this case, because the silicon nitride that forms the hard mask 120 has etching selectivity with respect to the silicon oxide that forms the buried insulating film 11, the etching rate of the buried insulating film 11 can be made slower than that of the hard mask 120. Therefore, when etching the hard mask 120, the etching amount (removing amount) of the buried insulating film 11 can be suppressed, so that the shape of the buried insulating film 11 can be maintained as the same shape as before etching. Accordingly, a reduction in the projection amount D (refer to FIG. 4) of the projecting parts 13 of the buried insulating film 11 can be suppressed. Furthermore, in the step of forming the trenches 10 and the step of burying the buried insulating film 11 into the trenches 10, because the common hard mask 120 can be used, simplification and a reduction in cost of the manufacturing process can be achieved.

On the other hand, in the CMOS region 4, together with the hard mask 120, the buried insulating film 11 that has remained in the openings in the hard mask 120 is also simultaneously removed. In this case, the buried insulating film 11 is formed so that its front surface becomes flush with the front surface of the semiconductor substrate 2. In addition, similar to the buried insulating film 11 in the memory cell region 3, the buried insulating film 11 in the CMOS region 4 may also be formed with projecting parts 13.

Next, in the HV-CMOS region 40 and the MV-CMOS region 70, n-type impurity ions are selectively doped, into regions where deep n-type wells 32 need to be formed, using a resist film, a silicon oxide film, or the like as a mask (not shown). For example, arsenic ($As^+$) ions or phosphorus ($P^+$) ions are used as the n-type impurity ions. Accordingly, deep n-type wells 32 are formed.

Next, in the HV-CMOS region 40 and the LV-CMOS region 90, n-type impurity ions are selectively doped, into respective regions where an n-type base region 54 and a deep n-type well 140 need to be formed, using a resist film, a silicon oxide film, or the like as a mask (not shown). For example, arsenic ($As^+$) ions or phosphorus ($P^+$) ions are used as the n-type impurity ions. Accordingly, an n-type base region 54 and a deep n-type well 140 are simultaneously formed.

Next, in the HV-CMOS region 40, p-type impurity ions are selectively doped, into a region where a p-type base region 43 needs to be formed, using a resist film, a silicon oxide film, or the like as a mask (not shown). For example, boron ($B^+$) ions are used as the p-type impurity ions. Accordingly, a p-type base region 43 is formed.

Next, as shown in FIGS. 13A and 13B and FIGS. 14A and 14B, a hard mask 122 is formed across the entire front surface of the semiconductor substrate 2 by, for example, a CVD method. The hard mask 122 is formed of a silicon nitride film having a thickness, for example, on the order of 300 Å. After formation of the hard mask 122, an oxide film 123 is formed on a front surface of the hard mask 122. The oxide film 123 can be formed by oxidizing the front surface of the hard mask 122 made of silicon nitride by, for example, a thermal oxidization method. In addition, the oxide film 123 may be formed by a CVD method.

Next, as shown in FIGS. 15A and 15B and FIGS. 16A and 16B, the oxide film 123, the hard mask 122, and the pad oxide film 114 present on the memory cell region 3 and the HV-CMOS region 40 are selectively removed by, for example, etching. Accordingly, in the memory cell region 3 and the HV-CMOS region 40, the front surface of the semiconductor substrate 2 is exposed.

Next, as shown in FIGS. 17A and 17B and FIGS. 18A and 18B, the semiconductor substrate 2 is thermally oxidized with the MV-CMOS region 70 and the LV-CMOS region 90 covered with the hard mask 122. Accordingly, a tunneling oxide film 37 is formed on the front surface of the semiconductor substrate 2 in the memory cell region 3 and the HV-CMOS region 40 not covered with the hard mask 122. Next, over the semiconductor substrate 2, a polysilicon film 115 added with impurity ions (for example, phosphorus ($P^+$) ions) is deposited. The thickness of the polysilicon film 115 is, for example, on the order of 700 Å.

Next, as shown in FIGS. 19A and 19B and FIGS. 20A and 20B, the polysilicon film 115 on the element separation portions 5 is selectively removed in the memory cell region 3. Accordingly, floating gates 26 each having overlapping parts 26a that overlap the projecting parts 13 of the buried insulating film 11 and a central part 26b that is selectively recessed are formed.

Next, as shown in FIGS. 21A and 21B and FIGS. 22A and 22B, an ONO film 36 having a three-layer structure is formed by stacking a silicon oxide film, a silicon nitride film, and a silicon oxide film in order over the semiconductor substrate 2. Next, a protective film 126 is formed on the ONO film 36. The protective film 126 is made of, for example, silicon nitride, and formed thinner than the hard mask 122 that covers the MV-CMOS region 70 and the LV-CMOS region 90. For example, the protective film 126 is on the order of 100 Å, and the hard mask 122 is on the order of 300 Å.

Next, a thermal oxidation step of the CMOS region 4 is performed. Specifically, thermal oxidation of the HV-CMOS region 40, the MV-CMOS region 70, and the LV-CMOS region 90 are performed in this order.

First, gate oxidation for the HV-CMOS region 40 is performed. As shown in FIGS. 23A and 23B and FIGS. 24A and 24B, the protective film 126, the ONO film 36, and the polysilicon film 115 that cover the HV-CMOS region 40 are selectively removed. In this case, also in the MV-CMOS region 70 and the LV-CMOS region 90, the protective film 126, the ONO film 36, and the polysilicon film 115 on the hard mask 122 are removed. Next, as a result of the tunneling oxide film 37 in the HV-CMOS region 40 being removed, the front surface of the semiconductor substrate 2 is exposed in the HV-CMOS region 40. When removing the tunneling oxide film 37, the oxide film 123 on the hard mask 122 is removed.

Next, as shown in FIGS. 25A and 25B and FIGS. 26A and 26B, the semiconductor substrate 2 is thermally oxidized with the hard mask 122 remaining in the MV-CMOS region 70 and the LV-CMOS region 90. The thermal oxidation is performed, for example, for 10 minutes to 30 minutes at 900° C. to 1000° C. Accordingly, a HV-nMOS gate insulating film 51 and a HV-pMOS gate insulating film 62 are simultaneously formed in the HV-CMOS region 40 not covered with the hard mask 122, the polysilicon film 115, the ONO film 36, etc. In this case, the hard mask 122 and the protective film 126 are also oxidized from the front surface side, so that silicon oxide parts are formed at their respective front surface portions. Also, in the present embodiment, the thickness of the protective film 126 is on the order of 100 Å, but it may be thinner still if in an arrangement where a part of silicon nitride remains in a lower portion of the protective film 126 after thermal oxidation of the HV-CMOS region 40 (namely, unless the protective film 126 is completely oxidized to be dominated by the silicon oxide part at the front surface).

Next, after supplying hydrofluoric acid (HF) onto the semiconductor substrate 2 to selectively remove the silicon oxide parts at the front surfaces of the hard mask 122 and the protective film 126, by supplying phosphoric acid ($H_3PO_4$), the hard mask 122 and the protective film 126 that cover the MV-CMOS region 70 and the LV-CMOS region 90 are simultaneously removed. In this case, because the protective film 126 has been formed thinner than the hard mask 122, the etching time required for removal of the protective film 126 can be shorter than the etching time for the hardmask 122. Therefore, removal of the protective film 126 can be reliably finished at the completion of removal of the hard mask 122. Accordingly, the protective film 126 can be prevented from remaining on the ONO film 36.

Next, gate oxidation for the MV-CMOS region 70 is performed. Specifically, as shown in FIGS. 27A and 27B and FIGS. 28A and 28B, the pad oxide film 114 is selectively removed from the MV-CMOS region 70 and the LV-CMOS region 90 exposed by removal of the hard mask 122. Then, the front surface of the semiconductor substrate 2 exposed in the MV-CMOS region 70 and the LV-CMOS region 90 is thermally oxidized. The thermal oxidation is performed at a lower temperature than that of gate oxidation for the HV-CMOS region 40, and performed, for example, for 5 minutes to 10 minutes at 850° C. to 950° C. Accordingly, a MV-nMOS gate insulating film 77 and a MV-pMOS gate insulating film 85 are simultaneously formed in the MV-CMOS region 70. Subsequently, an insulating film 116 formed in the LV-CMOS region 90 by the thermal oxidization is selectively removed.

Next, gate oxidation for the LV-CMOS region 90 is performed. As shown in FIGS. 29A and 29B and FIGS. 30A and 30B, by the front surface of the semiconductor substrate 2 exposed in the remaining LV-CMOS region 90 being thermally oxidized, a LV-nMOS gate insulating film 97 and a LV-pMOS gate insulating film 105 are simultaneously formed in the LV-CMOS region 90. The thermal oxidation is performed at a lower temperature than that of gate oxidation for the MV-CMOS region 70, and performed, for example, for 5 minutes to 10 minutes at 700° C. to 800° C.

Next, as shown in FIGS. 31A and 31B and FIGS. 32A and 32B, n-type impurity ions are selectively doped into regions where a MV-n-type well 81 and a LV-n-type well 101 need to be formed. Accordingly, a MV-n-type well 81 and a LV-n-type well 101 are simultaneously formed.

Next, p-type impurity ions are selectively doped into regions where a MV-p-type well 73 and a LV-p-type well 93 need to be formed. Accordingly, a MV-p-type well 73 and a LV-p-type well 93 are simultaneously formed.

Next, over the semiconductor substrate 2, a polysilicon film 117 added with impurity ions (for example, phosphorus ($P^+$) ions) is deposited. The thickness of the polysilicon film 117 is, for example, on the order of 210 nm.

Next, as shown in FIGS. 33A and 33B and FIGS. 34A and 34B, the polysilicon film 117 is selectively etched. Accordingly, a control gate 27, a HV-nMOS gate electrode 52, a HV-pMOS gate electrode 63, a MV-nMOS gate electrode 78, a MV-pMOS gate electrode 86, a LV-nMOS gate electrode 98, and a LV-pMOS gate electrode 106 are simultaneously formed. That is, the gate electrodes 52, 63, 78, 86, 98, and 106 of the CMOS region 4 are formed using the material of the control gate 27.

Subsequently, parts, in the tunnel oxide film 37, the HV-nMOS gate insulating film 51, the HV-pMOS gate insulating film 62, the MV-nMOS gate insulating film 77, the MV-pMOS gate insulating film 85, the LV-nMOS gate insulating film 97, and the LV-pMOS gate insulating film 105, other than parts present directly under the foregoing gate electrodes 27(26), 52, 63, 78, 86, 98, and 106 are selectively removed.

Next, as shown in FIGS. 35A and 35B and FIGS. 36A and 36B, a low-concentration n-type source layer 29, a low-concentration n-type drain layer 30, a HV-n-type drift region 50, a HV-p-type drift region 61, a MV-n-type source region 74, a MV-n-type drain region 75, a MV-p-type source region 82, a MV-p-type drain region 83, a LV-n-type source region 94, a LV-n-type drain region 95, a LV-p-type source region 102, and a LV-p-type drain region 103 are formed by selective ion doping into the semiconductor substrate 2.

Next, as shown in FIGS. 37A and 37B and FIGS. 38A and 38B, sidewalls 28, 53, 64, 79, 87, 99, and 107 are simultaneously formed at each of the side faces of the floating gate 26 and the control gate 27 and the side faces of the gate electrodes 52, 63, 78, 86, 98, and 106 of the CMOS region 4. The sidewalls 28, 53, 64, 79, 87, 99, and 107 are formed, after an insulating film such as a silicon nitride film is formed on the entire front surface of the semiconductor substrate 2 by, for example, a CVD method, by etching back the insulating film by dry etching.

Next, as shown in FIGS. 39A and 39B and FIGS. 40A and 40B, an n-type source region 23, an n-type drain region 24, a HV-n-type source region 44, a HV-n-type drain region 45, a HV-n-type source contact region 47, a HV-n-type drain contact region 48, a HV-p-type source region 55, a HV-p-type drain region 56, a HV-p-type source contact region 58, a HV-p-type drain contact region 59, a MV-n-type source contact region 80, a MV-n-type drain contact region 33, a MV-p-type source contact region 88, a MV-p-type drain contact region 89, a LV-n-type source contact region 100, a LV-n-type drain contact region 34, a LV-p-type source contact region 108, and a LV-p-type drain contact region 109 are formed by selective ion doping into the semiconductor substrate 2.

Next, a siliside is formed on the front surface of each of the control gate 27, the HV-nMOS gate electrode 52, the HV-pMOS gate electrode 63, the MV-nMOS gate electrode 78, the MV-pMOS gate electrode 86, the LV-nMOS gate electrode 98, the LV-pMOS gate electrode 106, the n-type source region 23, the n-type drain region 24, the HV-n-type source contact region 47, the HV-n-type drain contact region 48, the HV-p-type source contact region 58, the HV-p-type drain contact region 59, the MV-n-type source contact region 80, the MV-n-type drain contact region 33, the MV-p-type source contact region 88, the MV-p-type drain contact region 89, the LV-n-type source contact region 100, the LV-n-type drain contact region 34, the LV-p-type source contact region 108, and the LV-p-type drain contact region 109.

Thereafter, as shown in FIGS. 2A and 2B and FIGS. 3A and 3B, after an interlayer insulating film 110 is formed, various contact plugs 113 and wirings 111 are formed. Next, a surface protective film 118 made of an insulating material such as silicon nitride is formed so as to coat the interlayer insulating film 110 and the respective wirings 111 in the memory cell region 3 and the CMOS region 4, and openings (not shown) to expose the respective electrodes as pads for wire bonding are formed in the surface protective film 118.

Through the above steps, the semiconductor device 1 including the memory cell region 3 and the CMOS region 4 shown in FIGS. 1A and 1B to FIGS. 3A and 3B is obtained. In addition, a plurality of interlayer insulating films 110 may be stacked.

Figure 41A:
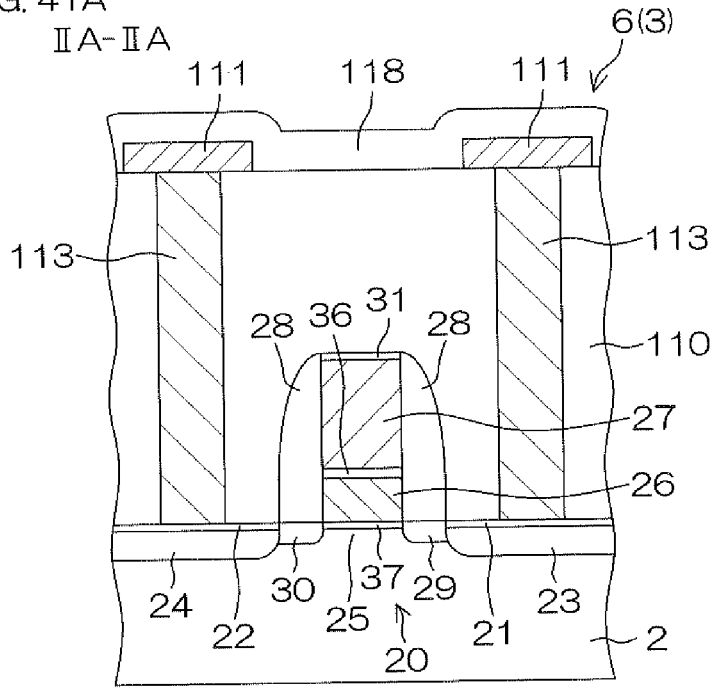
FIG. 41A is a sectional view of a semiconductor device according to a reference example of the present invention, and corresponds to a section that appears when the semiconductor device is cut along a cutting line IIA-IIA of FIG. 1A.
Figure 41B:
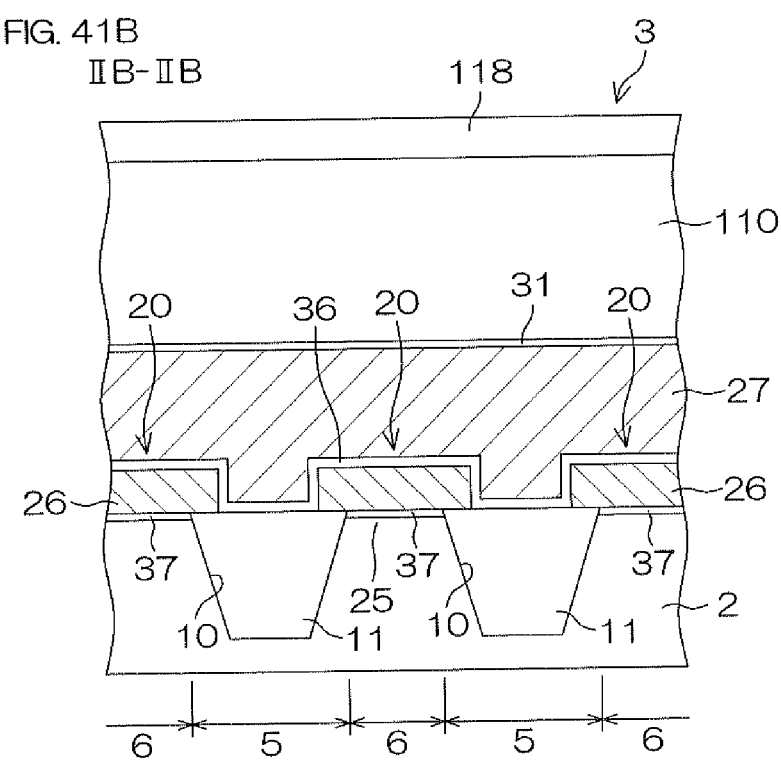
FIG. 41B is a sectional view of a semiconductor device according to a reference example of the present invention, and corresponds to a section that appears when the semiconductor device is cut along a cutting line IIB-IIB of FIG. 1A.
Figure 43A:
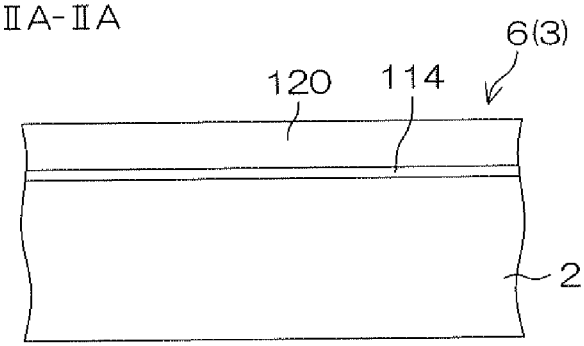
Figure 43B:
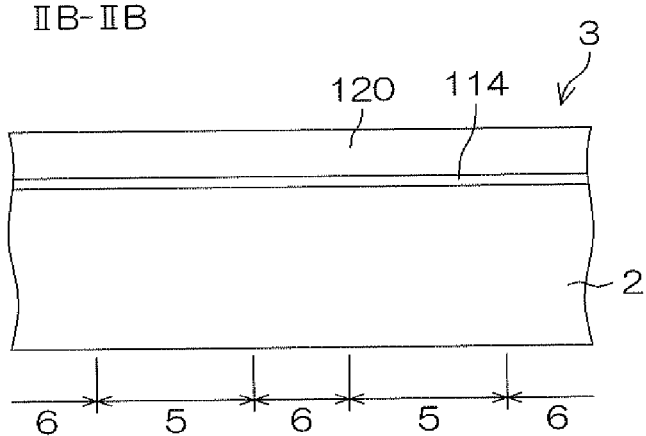
Figure 44A:
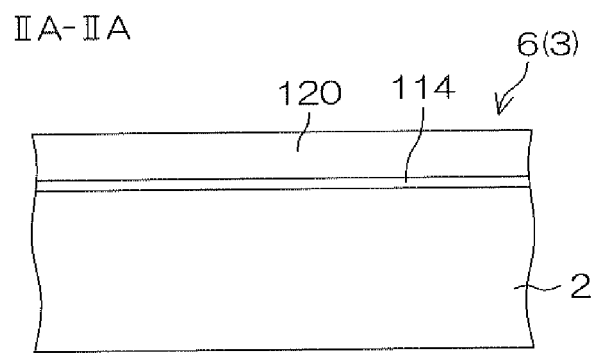
Figure 44B:
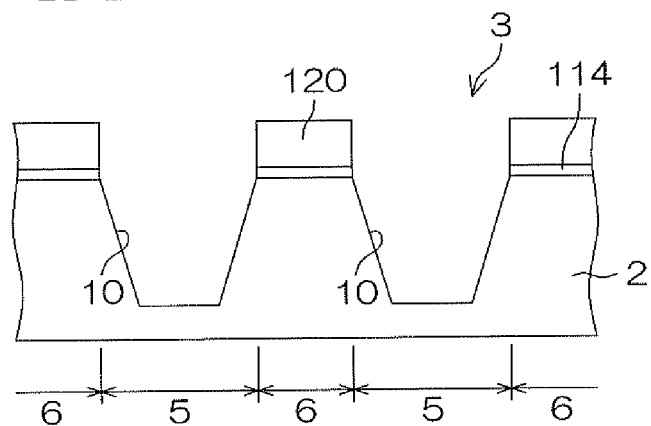

FIG. 41A is a sectional view of a semiconductor device 200 according to a reference example of the present invention, and corresponds to a section that appears when the semiconductor device 1 is cut along a cutting line IIA-IIA of FIG. 1A. FIG. 41B is a sectional view of a semiconductor device 200 according to a reference example of the present invention, and corresponds to a section that appears when the semiconductor device 1 is cut along a cutting line IIB-IIB of FIG. 1A. In FIGS. 41A and 41B, elements mutually corresponding to each other with those in FIGS. 2A and 2B described above are denoted by the same reference signs.

In the above-described semiconductor device 1, the buried insulating film 11 is formed so as to project upward further than the front surface of the semiconductor substrate 2, whereas in the present semiconductor device 200, the buried insulating film 11 is housed inside the trench 10 so that its upper face becomes almost flush with the front surface of the semiconductor substrate 2. Also, the floating gates 26 are provided so as to overlap end portions of the buried insulating film 11.

Also, the ONO film 36 is made of, as shown in FIG. 42, a film having an ONO (silicon oxide film-silicon nitride film-silicon oxide film) structure for which a silicon nitride film 361 is sandwiched by a pair of silicon oxide films 362 and 363. As the thicknesses of the respective films, the silicon nitride film 361 is on the order of 130 Å thick, the lower silicon oxide film 362 that is in contact with the floating gate 26 is on the order of 40 Å thick, and the upper silicon oxide film 363 that is in contact with the control gate 27 is on the order of 100 Å thick. Also, the ONO film 36 contains an N component in its front-most surface. Specifically, the upper silicon oxide film 363 of the ONO film 36 has a local minimum value Lmin where the N component concentration equals 0 at a halfway part in a thickness direction at distances from its front and back surfaces, and contains an N component at a concentration higher than that with said local minimum value Lmin in a part to contact the control gate 27. On the other hand, the lower silicon oxide film 362 of the ONO film 36 slightly contains an N component near the interference with the silicon nitride film 361, but does not have a local minimum value in terms of the N component concentration, and the N component concentration is 0 from a halfway part in the thickness direction thereof toward the side of the floating gate 26.

Other arrangements of the memory cell region 3 and the arrangements of the CMOS region 4 are the same as the arrangements of the semiconductor device 1 shown in FIGS. 2A and 2B and FIGS. 3A and 3B, respectively.

FIGS. 43A and 43B to FIGS. 60A and 60B are sectional views for explaining in the order of steps an example of a manufacturing process of the semiconductor device 200.

Here, only steps in the memory cell region 3 are shown, and steps in the CMOS region 4 will be omitted because these are the same as those of the method for manufacturing the above-described semiconductor device 1. Also, in terms also of the process of the memory cell region 3, only points different from those of the above-described semiconductor device 1 will be extracted for description.

Figure 45A:
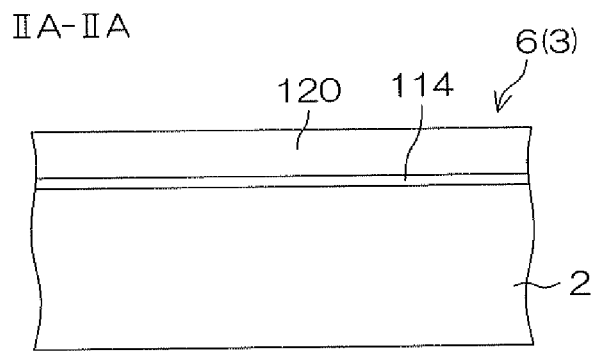
Figure 45B:
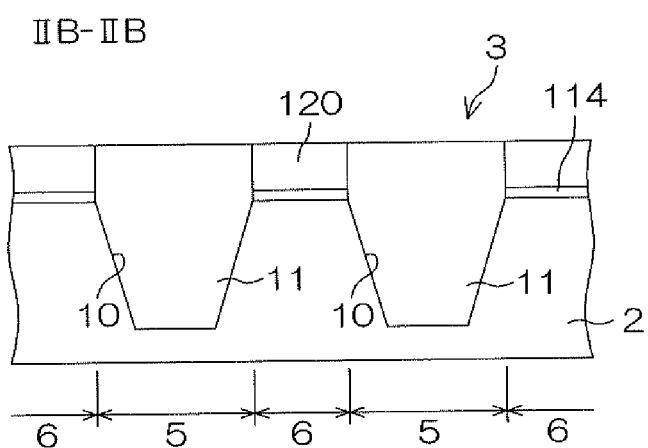
Figure 46A:
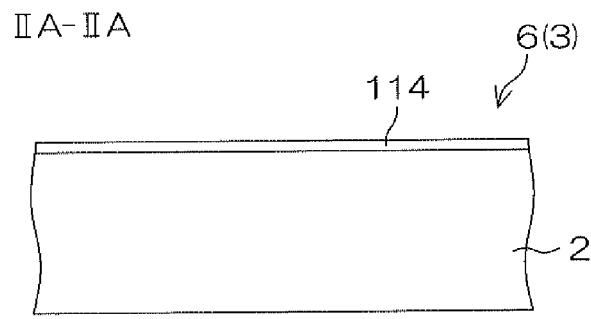
Figure 46B:
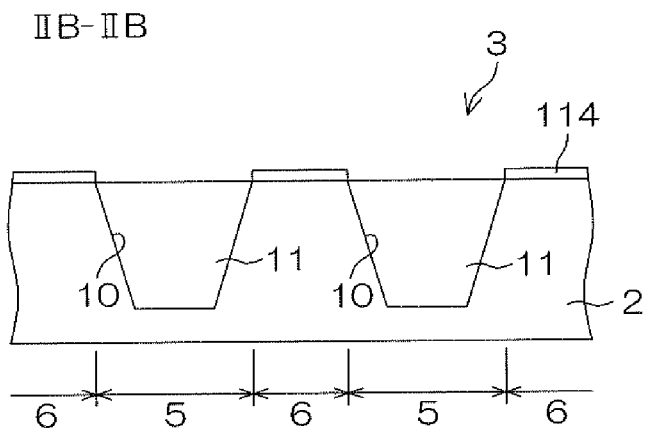
Figure 47A:
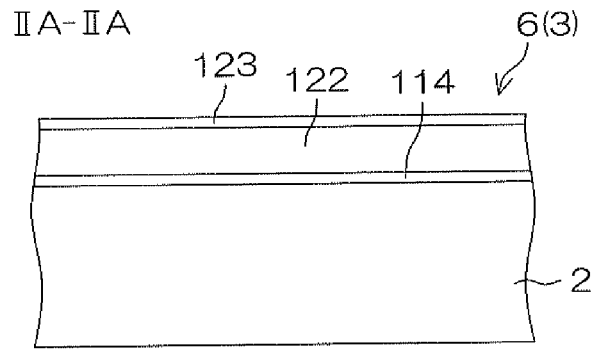
Figure 47B:
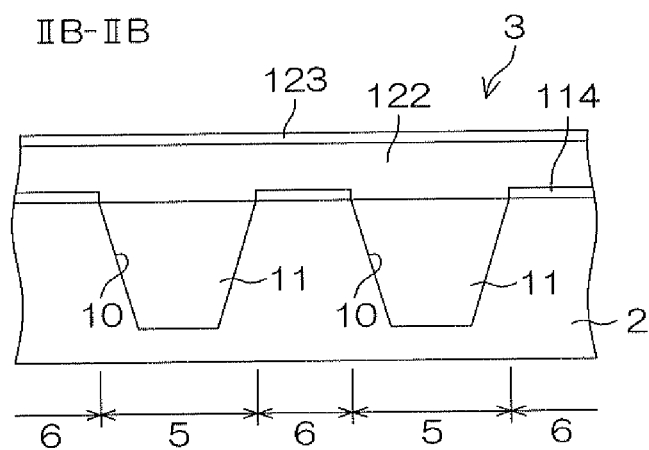
Figure 48A:
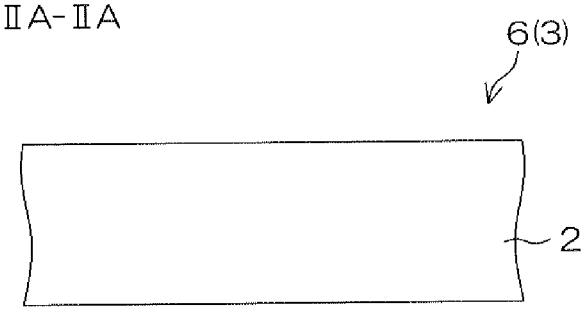
Figure 48B:
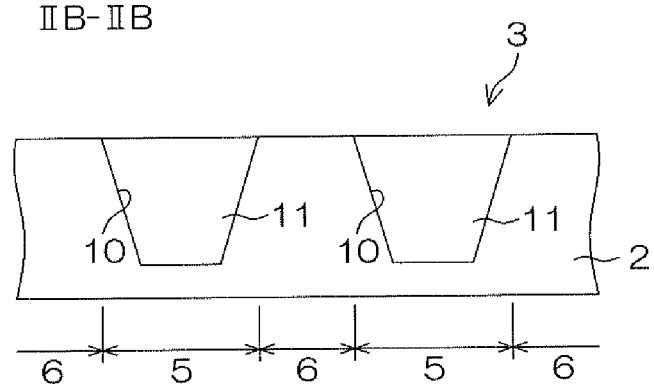
Figure 49A:
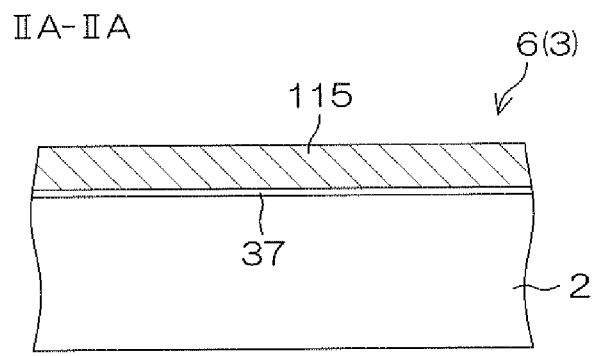
Figure 49B:
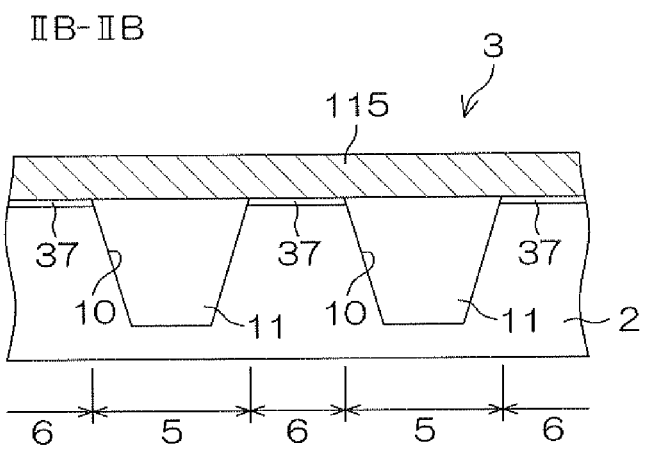
Figure 50A:
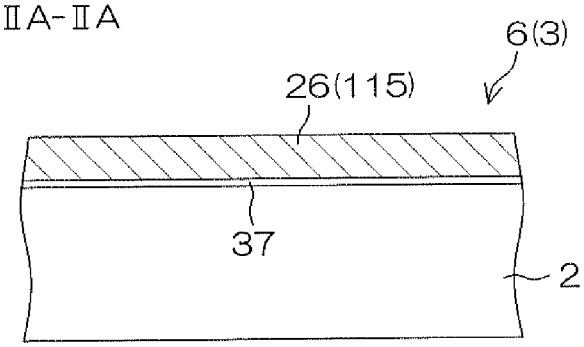
Figure 50B:
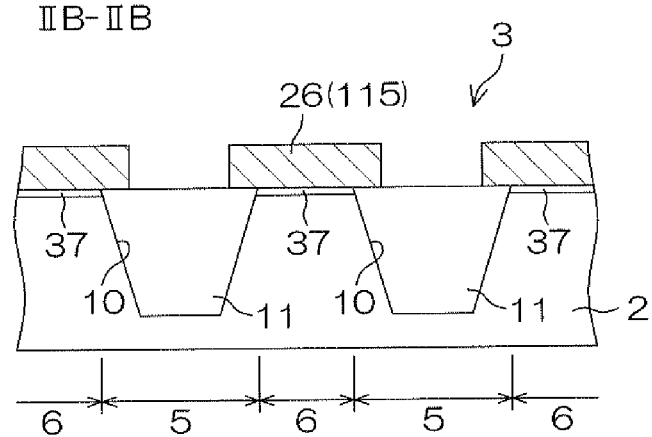

That is, in the manufacturing process of the semiconductor device 200, after the buried insulating film 11 is formed to form the element separation portions 5 in the step of FIGS. 45A and 45B, as shown in FIGS. 46A and 46B, together with the hard mask 120, the buried insulating film 11 that has remained in the openings in the hard mask 120 is removed. Accordingly, a buried insulating film 11 whose upper face is almost flush with the front surface of the semiconductor substrate 2 is obtained.

Other steps in the memory cell region 3 are basically the same as those of the manufacturing process of the above-described semiconductor device 1. However, some components are shown in slightly different shapes from those of the components of the semiconductor device 1 because the buried insulating film 11 in the above-mentioned shape is formed.

Figure 51A:
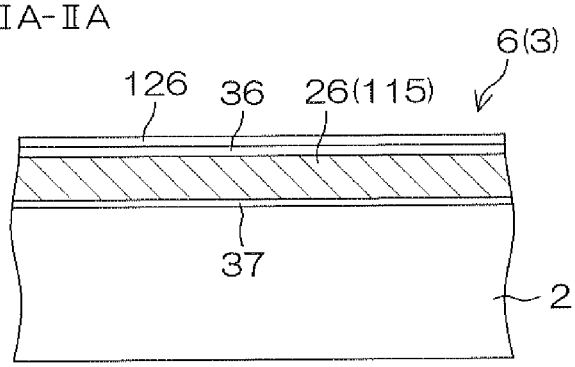
Figure 51B:
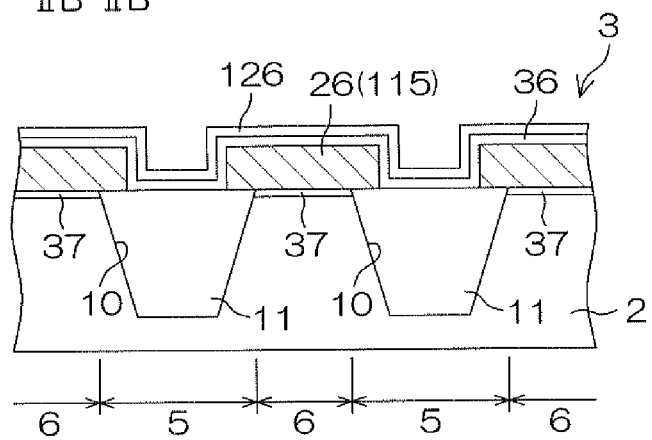
Figure 52A:
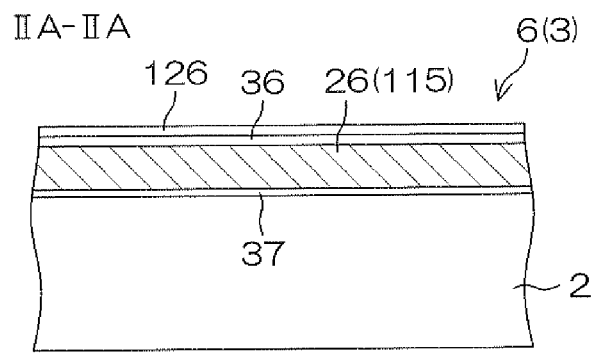
Figure 52B:
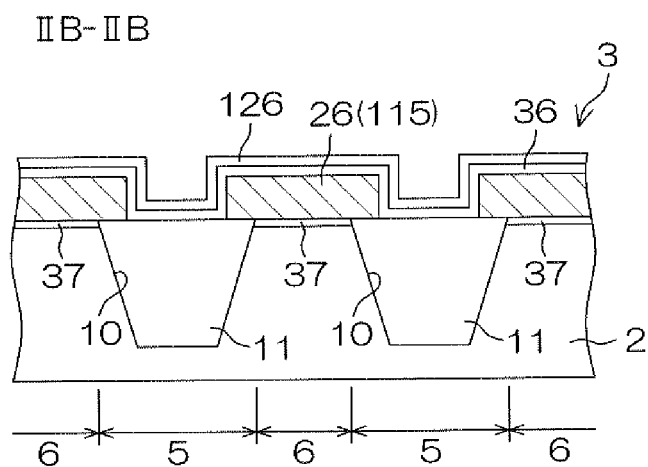
Figure 53A:
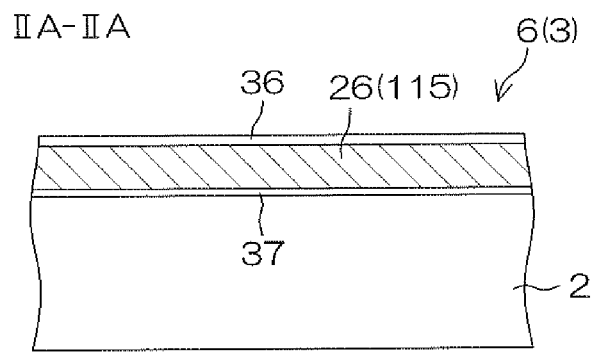
Figure 53B:
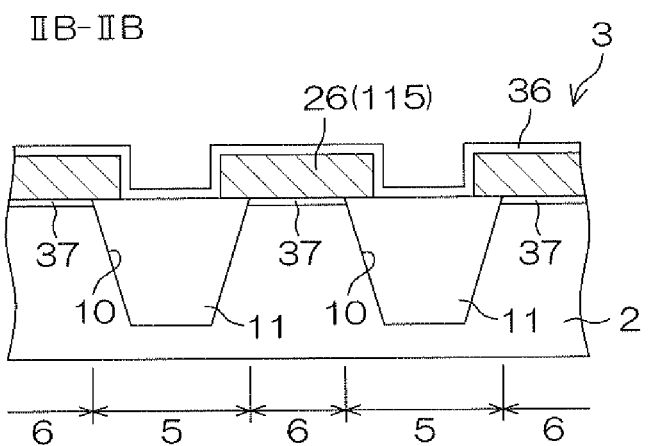
Figure 54A:
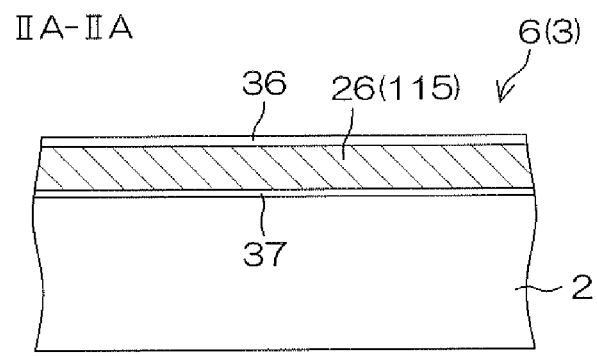
Figure 54B:
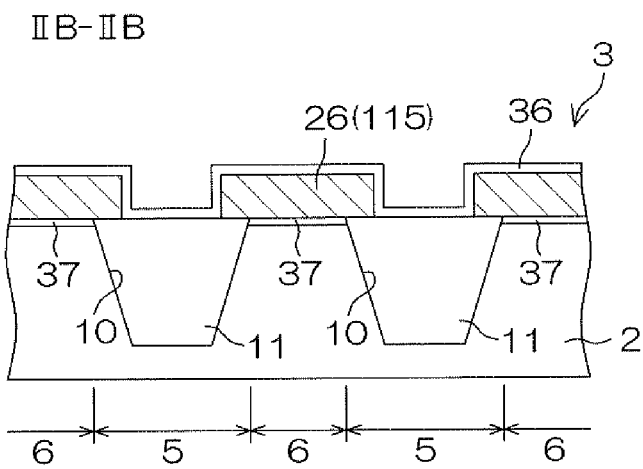
Figure 55A:
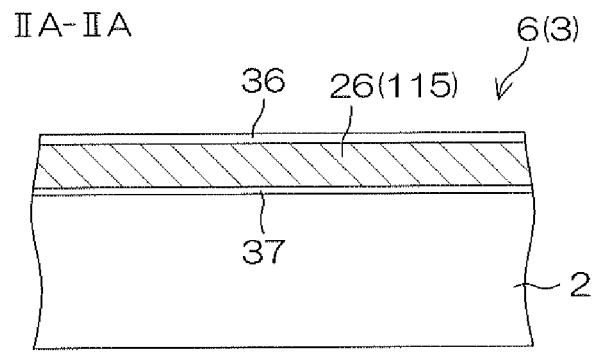
Figure 55B:
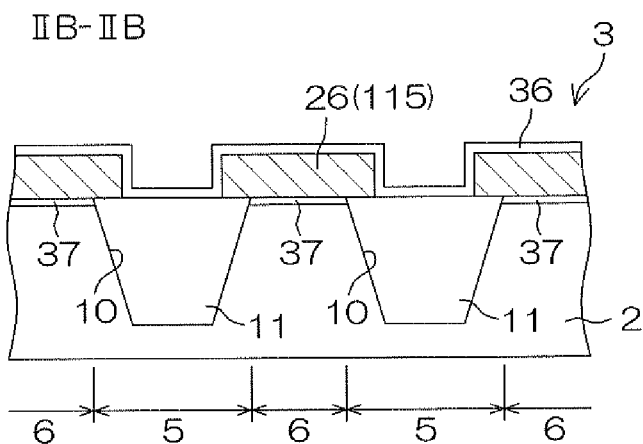
Figure 56A:
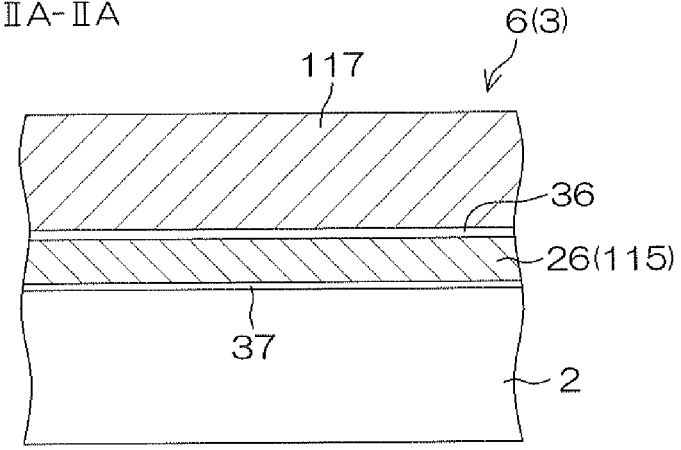
Figure 56B:
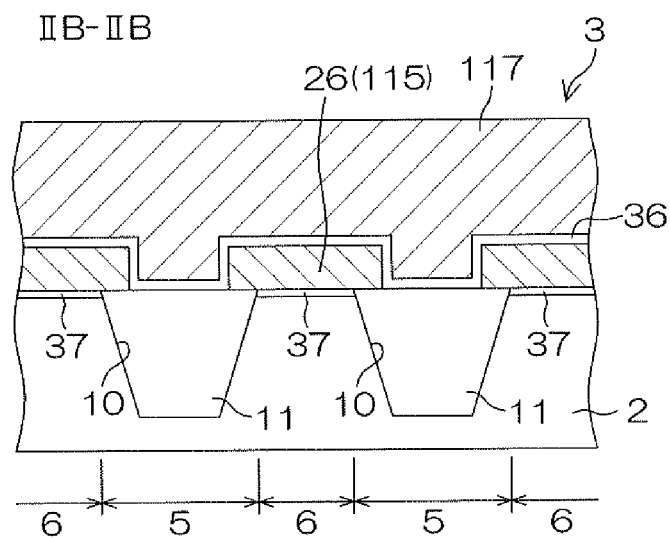
Figure 57A:
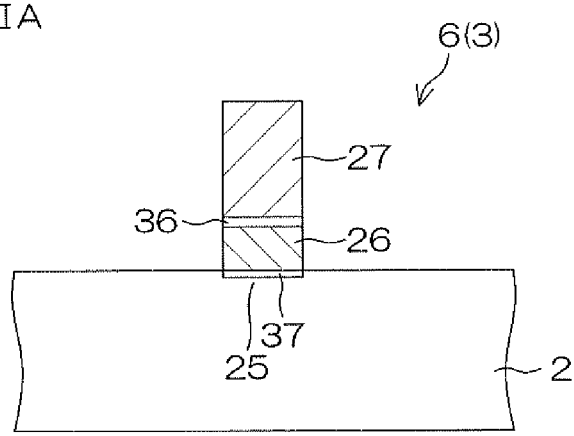
Figure 57B:
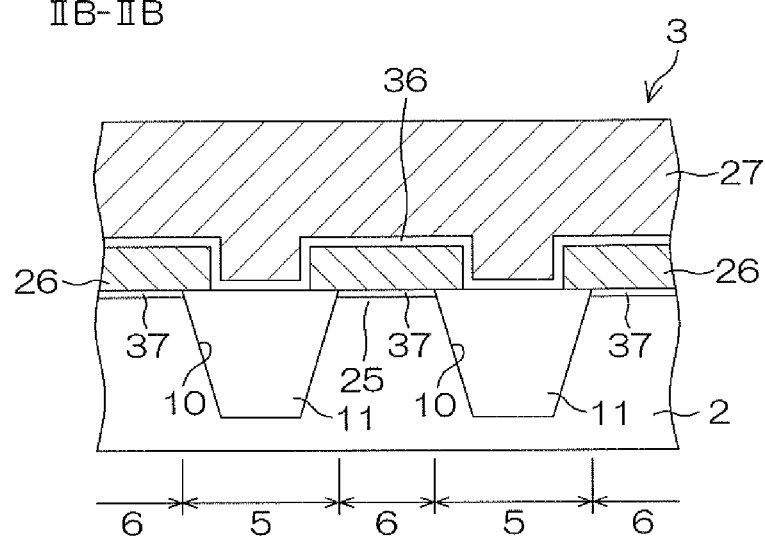
Figure 58A:
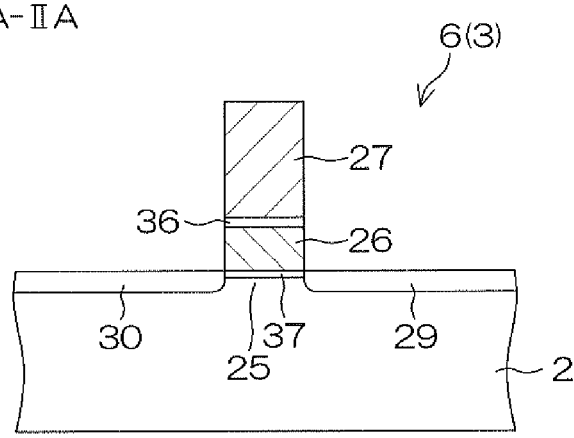
Figure 58B:
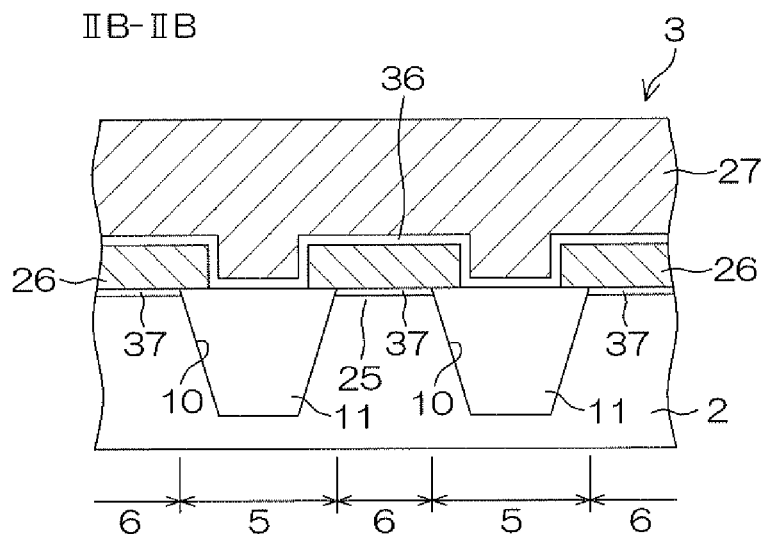
Figure 59A:
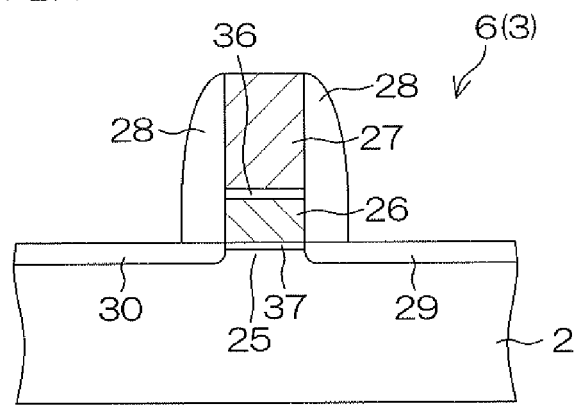
Figure 59B:
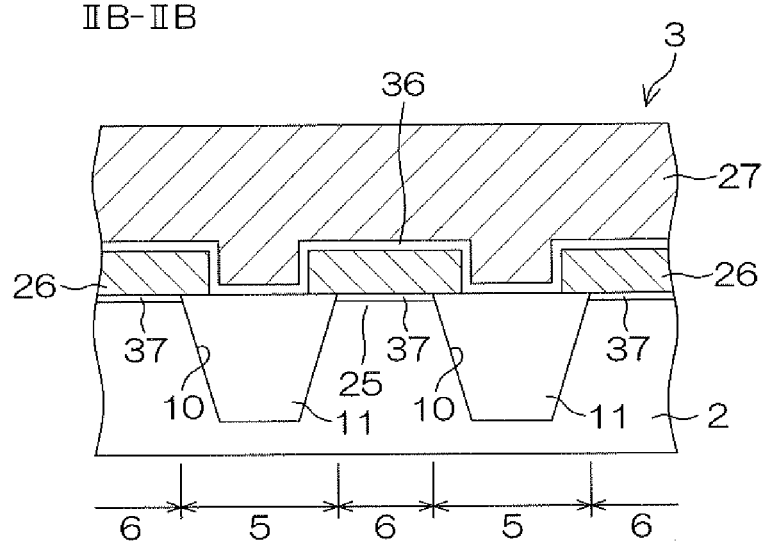
Figure 60A:
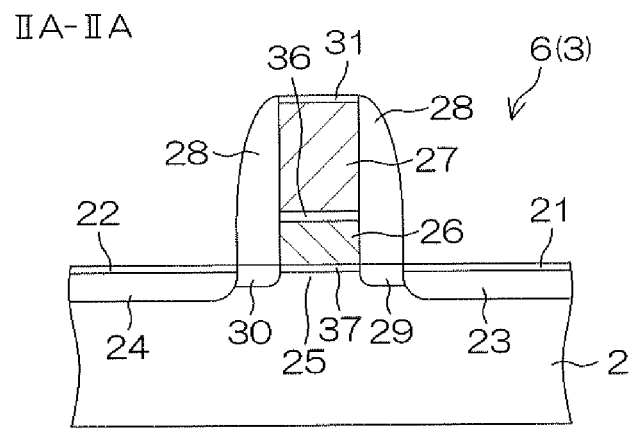
Figure 60B:
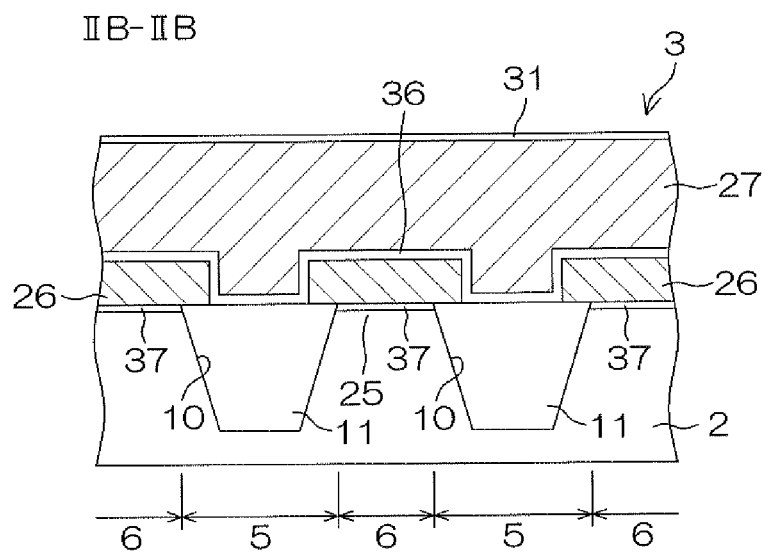

As above, according to the present reference example, an ONO film 36 having a three-layer structure is formed by stacking a silicon oxide film 362, a silicon nitride film 361, and a silicon oxide film 363 in order, which is an overlapping description with the above-described embodiment (refer to FIGS. 51A and 51B). Subsequently, gate oxidation for the HV-CMOS region 40 is performed with the ONO film 36 covered with the protective film 126 (refer to FIGS. 26A and 26B). Because the thermal oxidation is performed, for example, for 10 minutes to 30 minutes at 900° C. to 1000° C., if the ONO film 36 is completely exposed, under the influence of thermal oxidation on the upper silicon oxide film 363, its structure may change. For example, a variation in the film quality of the ONO film 36 may occur.

Therefore, in the present reference example, the influence the ONO film 36 receives due to the thermal oxidation can be suppressed by covering the ONO film 36 with the protective film 126 at the time of said thermal oxidation. As a result, a structural change of the ONO film 36 caused by said influence can be suppressed, and the influence on characteristics of the nonvolatile memory cell 20 can be reduced.

On the other hand, at the time of gate oxidation (refer to FIGS. 27A and 27B to FIGS. 30A and 30B) for the MV-CMOS region 70 and the LV-CMOS region 90 that are performed at relatively low temperatures, not covering the ONO film 36 with a protective film can save at least the trouble of forming a protective film only for thermal oxidation for these regions 70 and 90.

The embodiment and reference example of the present invention have been described above, however, the present invention and reference example can also be carried out in other modes.

For example, in the above-described embodiment and reference example of the present invention, arrangements for which the respective semiconductor parts of the semiconductor device 1, 200 are inverted in conductivity type may be adopted. For example, in the semiconductor device 1, the p-type parts may be n-type, and the n-type parts may be p-type.

Also, around the memory cell region 3 and the CMOS region 4, a peripheral circuit region formed with various elements such as a charge pump, a Zener diode, and a MIS transistor may be set.

The embodiments of the present invention are merely specific examples used to clarify the technical contents of the present invention, and the present invention should not be interpreted as being limited to only these specific examples, and the spirit and scope of the present invention shall be limited only by the accompanying claims.

In addition, from the contents of the embodiment and reference example described above, the following features can be extracted besides the inventions described in the claims.

(Section 1)

A method for manufacturing a semiconductor device selectively including a nonvolatile memory cell region and a transistor region on a common semiconductor substrate, including:

a step of selectively forming a floating gate in the nonvolatile memory cell region;

a step of forming an ONO film by stacking a silicon oxide ($SiO_2$) film, a silicon nitride (SiN) film, and a silicon oxide ($SiO_2$) film in this order on the floating gate;

a step of forming a protective film on the ONO film;

a step of forming a gate oxide film in the transistor region by selectively thermally-oxidizing the transistor region after formation of the protective film; and a step of removing the protective film after formation of the gate oxide film.

According to this method, an ONO film can be formed without changing the conventional process of stacking a silicon oxide ($SiO_2$) film, a silicon nitride (SiN) film, and a silicon oxide ($SiO_2$) film in this order, and furthermore, in the case of thermal oxidation of the transistor region, said ONO film can be protected by a protective film. Accordingly, the influence the ONO film receives due to said thermal oxidation can be suppressed. Also, when patterning (wet etching) of a gate oxide film is performed after said thermal oxidation, the influence the ONO film receives due to that wet etching can also be suppressed. As a result, a structural change (variation in film quality etc.) of the ONO film caused by said influence can be suppressed, and the influence on characteristics of the memory cell can be reduced.

(Section 2)

The method for manufacturing a semiconductor device according to section 1, wherein the step of forming the gate oxide film includes a step of forming a second protective film made of the same material as the protective film so as to cover a region out of a region where the gate oxide film needs to be formed in the transistor region, and thermal oxidation is performed after formation of the second protective film.

According to this method, because the protective film and the second protective film can be removed by the same step, the manufacturing process can be simplified.

(Section 3)

The method for manufacturing a semiconductor device according to section 2, wherein the protective film is thinner than the second protective film.

According to this method, because the etching time required for removal of the protective film can be shorter than the etching time for the second protective film, removal of the protective film can be reliably finished at the completion of removal of the second protective film. Accordingly, the protective film can be prevented from remaining on the ONO film.

(Section 4)

The method for manufacturing a semiconductor device according to any one of sections 1 to 3, wherein the protective film is made of a silicon nitride (SiN) film.

(Section 5)

The method for manufacturing a semiconductor device according to any one of sections 1 to 4, wherein the transistor region includes a first region for a first transistor whose rated voltage is over 5V and is not more than 40V, and the ONO film is kept covered with the protective film when the first region is thermally oxidized.

A gate oxide film for such a high-voltage transistor that the rated voltage (withstand voltage) is over 5V and is not more than 40V is formed thick by thermal oxidation at a relatively high temperature (for example, 900° C. to 1000° C.). Thus, keeping the ONO film covered with a protective film at the time of this thermal oxidation can effectively suppress the influence the ONO film receives.

(Section 6)

The method for manufacturing a semiconductor device according to section 5, wherein the region for the transistor further includes a second region for a second transistor whose rated voltage is not more than 5V, and the ONO film is kept exposed without being covered with the protective film when the second region is thermally oxidized.

In contrast to the invention according to section 5, a gate oxide film for such a low and middle-voltage transistor that the rated voltage (withstand voltage) is not more than 5V is formed thin by thermal oxidation at a relatively low temperature (for example, 850° C. to 950° C.). Thus, not covering the ONO film with a protective film at the time of this thermal oxidation can save at least the trouble of forming a protective film only for thermal oxidation of the region for a transistor whose rated voltage is not more than 5V.

(Section 7)

The method for manufacturing a semiconductor device according to any one of sections 1 to 6, wherein the step of forming the gate oxide film includes a step of forming a gate oxide film whose thickness is 380 Å to 440 Å with the ONO film covered with the protective film.

For forming a gate oxide film whose thickness is 380 Å to 440 Å, it is necessary to perform thermal oxidation at a relatively high temperature (for example, 900° C. to 1000° C.). Thus, keeping the ONO film covered with a protective film at the time of this thermal oxidation can effectively suppress the influence the ONO film receives.

(Section 8)

The method for manufacturing a semiconductor device according to any one of sections 1 to 7, further including a step of forming a control gate on the ONO film and simultaneously forming a gate electrode made of the same material as the control gate on the gate oxide film after removal of the protective film.

According to this method, because the gate electrodes can be simultaneously formed in the nonvolatile memory cell region and the transistor region, the manufacturing process can be simplified.

(Section 9)

The method for manufacturing a semiconductor device according to any one of sections 1 to 8, wherein the transistor region includes a CMOS transistor region.

(Section 10)

The method for manufacturing a semiconductor device according to section 9, wherein the CMOS transistor region selectively includes a high-voltage CMOS region whose rated voltage is over 5V and is not more than 40V, a middle-voltage CMOS region whose rated voltage is not less than 2V and is not more than 5V, and a low-voltage CMOS region whose rated voltage is less than 2V.

(Section 11)

A semiconductor device including:
a semiconductor substrate on which a nonvolatile memory cell region and a transistor region are formed;
a floating gate formed in the nonvolatile memory cell region;
an ONO film formed on the floating gate, having a structure for which a silicon oxide (SiO$_2$) film, a silicon nitride (SiN) film, and a silicon oxide (SiO$_2$) film are stacked in this order; and
a gate oxide film formed in the transistor region, wherein the ONO film contains an N component in its front-most surface.

This semiconductor device can be manufactured by the method for manufacturing a semiconductor device according to section 1. Therefore, in the manufacturing process, the ONO film has received little influence of thermal oxidation and wet etching. Thus, a semiconductor device formed with a nonvolatile memory cell having an ONO film having excellent film quality can be provided.

(Section 12)

The semiconductor device according to section 11, further including a control gate formed on the ONO film, wherein
the ONO film, in an upper silicon oxide film that is in contact with the control gate, has a local minimum value Lmin where an N component concentration equals 0 at a halfway part in a thickness direction at distances from its front and back surfaces, and contains an N component at a concentration higher than that with the local minimum value Lmin in a part to contact the control gate.

(Section 13)

The semiconductor device according to section 11 or 12, wherein the transistor region includes a first region for a first transistor whose rated voltage is over 5V and is not more than 40V.

This semiconductor device can be manufactured by the method for manufacturing a semiconductor device according to section 5.

(Section 14)

The semiconductor device according to section 13, wherein the first transistor includes a gate oxide film whose thickness is 380 Å to 440 Å.

This semiconductor device can be manufactured by the method for manufacturing a semiconductor device according to section 7.

(Section 15)

The semiconductor device according to any one of sections 11 to 14, wherein the transistor region includes a CMOS transistor region.

This semiconductor device can be manufactured by the method for manufacturing a semiconductor device according to section 9.

(Section 16)

The semiconductor device according to section 15, wherein the CMOS transistor region selectively includes a high-voltage CMOS region whose rated voltage is over 5V and is not more than 40V, a middle-voltage CMOS region whose rated voltage is not less than 2V and is not more than 5V, and a low-voltage CMOS region whose rated voltage is less than 2V.

This semiconductor device can be manufactured by the method for manufacturing a semiconductor device according to section 10.

The invention claimed is:

1. A semiconductor device selectively including a nonvolatile memory cell on a semiconductor substrate, comprising:
a trench disposed in the semiconductor substrate;
an element separation portion buried into the trench such that the element separation portion has a projecting part projecting from the semiconductor substrate, the element separation portion defining an active region in a first region for the nonvolatile memory cell of the semiconductor substrate, the element separation portion having a flat surface parallel to a front surface of the semiconductor substrate throughout an upper surface thereof;
a plurality of floating gates disposed in the active region, the plurality of floating gates being arranged next to each other across a space;
a control gate stacked on the floating gate;
a first insulating film disposed between the plurality of floating gates and the control gate, the first insulating film having a substantially constant thickness and being continuously formed along an upper surface of the plurality of floating gates, a side surface of the plurality of floating gates and the upper surface of the element separation portion such that the first insulating film is in contact with the upper surface of the plurality of floating gates, the side surface of the plurality of floating gates and the upper surface of the element separation portion; and
a tunneling insulating film disposed on the semiconductor substrate and facing the plurality of floating gates;
wherein the plurality of floating gates are directly formed on the tunneling insulating film and are continuously formed along a side surface and the upper surface of the element separation portion,
wherein a width of the space is larger than a depth of the space,
wherein the control gate has a flat upper surface directly above the space,
wherein each floating gate has overlapping parts which overlap at both end portions thereof with the element separation portions, and has a concave surface in a central part sandwiched by both end portions, and
wherein the concave surface is a curved surface having a smooth downward incline from the overlapping parts toward the central part such that the central part is entirely curved.

2. The semiconductor device according to claim 1, wherein:
the active region is formed in plural numbers so as to be adjacent across the element separation portion; and
the plurality of floating gates, disposed on the active regions adjacent to each other, overlap at their end portions with the element separation portion.

3. The semiconductor device according to claim 2, wherein the plurality of floating gates overlap at both end portions thereof with the element separation portions, and have a concave surface in a central part sandwiched by both end portions.

4. The semiconductor device according to claim 1, wherein the projecting part has a side face vertical to the front surface of the semiconductor substrate.

5. The semiconductor device according to claim 1, wherein the element separation portion includes an STI (Shallow Trench Isolation) structure for which the trench is filled back with an insulating material.

6. The semiconductor device according to claim 1, wherein the active region has a width of 0.13 μm or more.

7. The semiconductor device according to claim 1, wherein:
   the semiconductor device further includes another semiconductor element disposed in a second region out of the first region; and
   the element separation portion further defines an active region in the second region.

8. The semiconductor device according to claim 7, wherein a projection amount of the element separation portion in the second region is smaller than a projection amount of the element separation portion in the first region.

9. The semiconductor device according to claim 7, wherein the other semiconductor element includes a CMOS transistor.

10. The semiconductor device according to claim 1, wherein the floating gate is composed of one layer.

11. The semiconductor device according to claim 1, wherein the control gate covers the floating gate such that an upper surface of the control gate is flat.

* * * * *